(12) United States Patent
Miyamoto

(10) Patent No.: US 10,950,705 B2
(45) Date of Patent: Mar. 16, 2021

(54) ACTIVE MATRIX SUBSTRATE

(71) Applicant: Sharp Kabushiki Kaisha, Sakai (JP)

(72) Inventor: Tadayoshi Miyamoto, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 91 days.

(21) Appl. No.: 16/485,827

(22) PCT Filed: Feb. 6, 2018

(86) PCT No.: PCT/JP2018/004076
§ 371 (c)(1),
(2) Date: Aug. 14, 2019

(87) PCT Pub. No.: WO2018/150962
PCT Pub. Date: Aug. 23, 2018

(65) Prior Publication Data
US 2020/0052083 A1    Feb. 13, 2020

(30) Foreign Application Priority Data
Feb. 15, 2017   (JP) .............................. JP2017-025960

(51) Int. Cl.
H01L 29/423   (2006.01)
H01L 29/786   (2006.01)
(Continued)

(52) U.S. Cl.
CPC ...... *H01L 29/42384* (2013.01); *G02F 1/1368* (2013.01); *H01L 27/1225* (2013.01);
(Continued)

(58) Field of Classification Search
CPC .......... H01L 27/3241; H01L 29/42384; H01L 29/786; H01L 29/7869; H01L 29/78693; G02F 2001/133388
See application file for complete search history.

(56) References Cited

U.S. PATENT DOCUMENTS 5,563,432 A    10/1996   Miura et al.
7,482,628 B2 *  1/2009   Kang .................. G02F 1/13454
                                                  257/257
(Continued)

FOREIGN PATENT DOCUMENTS

JP    64-84297 A    3/1989
JP    04-137668 A   5/1992
(Continued)

OTHER PUBLICATIONS

Official Communication issued in International Patent Application No. PCT/JP2018/004076, dated Apr. 10, 2018.

Primary Examiner — Jose R Diaz
(74) Attorney, Agent, or Firm — Keating & Bennett, LLP

(57) ABSTRACT

An active matrix substrate includes a peripheral circuit including a TFT (30A) supported on a substrate (1). When viewed in a direction normal to the substrate (1), a first gate electrode (3) of the TFT (30A) includes a first edge portion and a second edge portion (3e1, 3e2) opposing each other. The first edge portion and the second edge portion extend across an oxide semiconductor layer (7) in a channel width direction. At least one of the first edge portion and the second edge portion includes, in a region overlapping with the oxide semiconductor layer (7), a first recess portion (40) recessed in a channel length direction and a first part (41) adjacent to the first recess portion in the channel width direction. When viewed in the direction normal to the substrate (1), a source electrode (8) or a drain electrode (9) of the TFT (30A) overlaps with at least a part of the first recess portion (40) and at least a part of the first part (41).

14 Claims, 17 Drawing Sheets

(51) Int. Cl.
*H01L 27/32* (2006.01)
*G02F 1/1368* (2006.01)
*H01L 27/12* (2006.01)

(52) U.S. Cl.
CPC ........ *H01L 27/3241* (2013.01); *H01L 29/786* (2013.01); *H01L 29/7869* (2013.01)

(56) References Cited

U.S. PATENT DOCUMENTS

| | | | |
|---|---|---|---|
| 8,723,170 B2* | 5/2014 | Im | H01L 51/5296 257/40 |
| 2007/0285593 A1 | 12/2007 | Yamashita | |
| 2008/0225024 A1 | 9/2008 | Ito | |
| 2009/0323005 A1 | 12/2009 | Ota | |
| 2010/0102314 A1 | 4/2010 | Miyairi et al. | |
| 2011/0297937 A1 | 12/2011 | Kim et al. | |
| 2012/0138922 A1 | 6/2012 | Yamazaki et al. | |
| 2013/0038518 A1 | 2/2013 | Tagawa et al. | |
| 2013/0320334 A1 | 12/2013 | Yamazaki et al. | |
| 2014/0286076 A1 | 9/2014 | Aoki et al. | |
| 2015/0108467 A1 | 4/2015 | Moriguchi et al. | |

FOREIGN PATENT DOCUMENTS

| | | |
|---|---|---|
| JP | 07-94753 A | 4/1995 |
| JP | 2006-119404 A | 5/2006 |
| JP | 2007-310180 A | 11/2007 |
| JP | 2008-032899 A | 2/2008 |
| JP | 2008-225036 A | 9/2008 |
| JP | 2010-008758 A | 1/2010 |
| JP | 2010-123939 A | 6/2010 |
| JP | 2010-199457 A | 9/2010 |
| JP | 2011-258926 A | 12/2011 |
| JP | 2012-134475 A | 7/2012 |
| JP | 2014-007399 A | 1/2014 |
| JP | 2014-209727 A | 11/2014 |
| WO | 2011/118079 A1 | 9/2011 |
| WO | 2012/086513 A1 | 6/2012 |

* cited by examiner (a)

(b)

(a)

(b)

(a)

(b)

(c)

(a)

(b)

ACTIVE MATRIX SUBSTRATE

TECHNICAL FIELD

The present invention relates to an active matrix substrate.

BACKGROUND ART

An active matrix substrate that is used in a liquid display device or the like has a display area that has multiple pixels and an area (a non-display area or a frame area) other than the display area. A switching element such as a Thin Film Transistor (hereinafter, referred to as "TFT") is provided for each pixel in the display area. As such a switching element, a TFT (hereinafter, referred to as "amorphous silicon TFT") of which an activation layer is an amorphous silicon film, or a TFT (hereinafter, referred to as "polycrystalline silicon TFT") of which an activation layer is a polycrystalline silicon film has been widely used in the related art.

It has been proposed that instead of amorphous silicon or polycrystalline silicon, an oxide semiconductor is used as a material of the activation layer of the TFT. Such a TFT is referred to as "oxide semiconductor TFT". The oxide semiconductor has higher mobility than the amorphous silicon. For this reason, it is possible that the oxide semiconductor TFT operates at a higher speed than the amorphous silicon TFT.

In some cases, a peripheral circuit such as a drive circuit is monolithically (integrally) formed in a non-display area of the active matrix substrate. By monolithically forming the dive circuit, narrowing-down of the non-display area or cost reduction that results from simplifying a mounting process is realized. For example, in some cases, in the non-display area, a gate driver circuit is monolithically formed, and a source driver circuit is mounted using Chip on Glass (COG).

It is proposed that in a device in which narrowing-down of a frame is highly desirable, such as a smartphone, a source switch (source shared driving (SSD) circuit) be monolithically formed in addition to the gate driver (for example, PTL 1). The SSD circuit is a circuit that distributes, to multiple source lines, video data from one video signal line that runs from each terminal of the source driver. By mounting the SSD circuit, an area (a terminal-portion formation area) in which a terminal portion is formed, of the non-display area can be further narrowed. Furthermore, the number of outputs from the source driver can be reduced, and circuit scale can be decreased. Consequently, the cost of a driver IC can be reduced.

A peripheral circuit such as the drive circuit or the SSD circuit includes a TFT. In the present specification, a TFT that is positioned as a switching element in each pixel in the display area is referred to as "pixel TFT" and a TFT that constitutes the peripheral circuit is referred to as "circuit TFT". From the perspective of a manufacturing process, it is desirable that, in an active matrix substrate that uses an oxide semiconductor TFT as the pixel TFT, an oxide semiconductor TFT that uses the same oxide semiconductor film as the pixel TFT be formed as the circuit TFT.

CITATION LIST

Patent Literature

PTL 1: International Publication No. 2011/118079

SUMMARY OF INVENTION

Technical Problem

Since the oxide semiconductor has a mobility lower than that of polycrystalline silicon by approximately one order of magnitude, the oxide semiconductor TFT has lower current driving power than a polycrystalline silicon TFT. Therefore, among circuit TFTs, when a TFT allowing a comparatively large electric current to flow, for example, a TFT that constitutes an SSD circuit (hereinafter, referred to as "SSD circuit TFT") is formed using the oxide semiconductor, a channel width of the TFT needs to be larger than when it is formed using the polycrystalline silicon TFT, which results in an increase in size of the TFT. In order to further narrow the non-display area (frame area), among the circuit TFTs, the TFT allowing a comparatively large electric current to flow needs to be further reduced in size.

The TFT is usually designed such that a source/drain electrode and a gate electrode are overlapped with each other when viewed in a direction normal to the substrate, while taking alignment accuracy into consideration. However, when the size of the TFT is reduced, parasitic capacitances Cgd, Cgs between the source/drain electrode and the gate electrode ("gate-source/drain parasitic capacitances") may have a more significant influence on TFT characteristics. As a result, problems such as a decrease in switching speed of the circuit TFT, or the like, may occur.

Embodiments of the present invention have been made in view of the above circumstances, and it is an object thereof to reduce, in an active matrix substrate on which peripheral circuits including a TFT are monolithically formed, the size of the TFT while ensuring desired TFT characteristics.

Solution to Problem

An active matrix substrate according to an embodiment of present invention has a display area including multiple pixels and has a non-display area provided in the vicinity of the display area. The active matrix substrate includes a substrate, at least one thin-film transistor (TFT) that is supported on the substrate and disposed in the non-display area, and a peripheral circuit including the at least one TFT. The at least one TFT includes a first gate electrode, a gate insulation layer that covers the first gate electrode, an oxide semiconductor layer disposed on the gate insulation layer so as to at least partially overlap with the first gate electrode via the gate insulation layer, a source electrode disposed on the oxide semiconductor layer so as to be in contact with one end of the oxide semiconductor layer, and a drain electrode disposed on the oxide semiconductor layer so as to be in contact with another end of the oxide semiconductor layer. When viewed in a direction normal to the substrate, the first gate electrode has a first edge portion and a second edge portion opposing each other, the first edge portion and the second edge portion extend across the oxide semiconductor layer in a channel width direction of the at least one TFT, and at least one of the first edge portion and the second edge portion has, in a region overlapping with the oxide semiconductor layer, a first recess portion recessed in a channel length direction of the at least one TFT and a first part adjacent to the first recess portion in the channel width direction. When viewed in the direction normal to the substrate, the source electrode or the drain electrode overlaps with at least a part of the first recess portion and at least a part of the first part.

In an embodiment, when viewed in the direction normal to the substrate, both of the first edge portion and the second edge portion have the first recess portion in the region overlapping with the oxide semiconductor layer.

In an embodiment, when viewed in the direction normal to the substrate, one of the first edge portion and the second edge portion has the first recess portion in the region overlapping with the oxide semiconductor layer, and another of the first edge portion and the second edge portion has a first protruding portion protruding in the channel length direction and has two notch portions each positioned on a corresponding one of both sides of the first protruding portion in the region overlapping with the oxide semiconductor layer, and when viewed in the direction normal to the substrate, the source electrode or the drain electrode overlaps with at least a part of the first protruding portion and at least a part of the two notch portions.

In an embodiment, a width of the first recess portion in the channel width direction is 20% or more and 80% or less of a channel width W of the at least one TFT, and a depth of the first recess portion is 20% or more and 80% or less of a channel length L of the at least one TFT.

In an embodiment, the oxide semiconductor layer has an offset region between the source electrode and the drain electrode when viewed in the direction normal to the substrate, the offset region not overlapping with any of the source electrode, the drain electrode, and the first gate electrode, and when viewed in the direction normal to the substrate, the offset region overlaps with a part of the first recess portion.

In an embodiment, when viewed in the direction normal to the substrate, a source edge portion of the source electrode which opposes the drain electrode and/or a drain edge portion of the drain electrode which opposes the source electrode has a second recess portion recessed in the channel length direction, and the second recess portion overlaps with at least a part of the first recess portion.

In an embodiment, when viewed in the direction normal to the substrate, one of a source edge portion of the source electrode which opposes the drain electrode and a drain edge portion of the drain electrode which opposes the source electrode has a second protruding portion protruding in the channel length direction and another of the source edge portion of the source electrode which opposes the drain electrode and the drain edge portion of the drain electrode which opposes the source electrode has a second recess portion recessed in the channel length direction, and the second protruding portion overlaps with at least a part of the first protruding portion, and the second recess portion overlaps with at least a part of the first recess portion.

In an embodiment, the active matrix substrate further includes a transparent electrode disposed in the display area, in which the at least one TFT further includes a second gate electrode disposed on the oxide semiconductor layer via an insulation film, and the second gate electrode is formed using the same transparent conductive film as the transparent electrode.

In an embodiment, when viewed in the direction normal to the substrate, the second gate electrode has a third edge portion and a fourth edge portion opposing each other, the third edge portion and the fourth edge portion extend across the oxide semiconductor layer in the channel width direction, and at least one of the third edge portion and the fourth edge portion has a third recess portion recessed in the channel length direction in the region overlapping with the oxide semiconductor layer. When viewed in the direction normal to the substrate, the third recess portion at least partially overlaps with the first recess portion, and the source electrode or the drain electrode at least partially overlaps with both of the third recess portion and the first recess portion.

In an embodiment, when viewed in the direction normal to the substrate, the second gate electrode has a third edge portion and a fourth edge portion opposing each other, the third edge portion and the fourth edge portion extend across the oxide semiconductor layer in the channel width direction, and at least one of the third edge portion and the fourth edge portion has a third protruding portion protruding in the channel length direction in the region overlapping with the oxide semiconductor layer. When viewed in the direction normal to the substrate, the third protruding portion at least partially overlaps with the first recess portion, and the source electrode or the drain electrode at least partially overlaps with both of the third protruding portion and the first recess portion.

In an embodiment, the active matrix substrate further includes multiple source bus lines extending in the channel width direction and multiple gate bus lines extending in the channel length direction, in the display area. The peripheral circuit includes a source switching circuit that distributes video data from one video signal line to n source bus lines (n is an integer of two or more) among the multiple source bus lines.

In an embodiment, when viewed in the direction normal to the substrate, an overlap area of the drain electrode and the first gate electrode is smaller than an overlap area of the source electrode and the first gate electrode.

In an embodiment, the oxide semiconductor layer includes an In—Ga—Zn—O-based semiconductor.

In an embodiment, the In—Ga—Zn—O-based semiconductor includes a crystalline portion.

Advantageous Effects of Invention

According to an embodiment of the present invention, the active matrix substrate in which the peripheral circuits including the oxide semiconductor TFT are monolithically formed makes it possible to reduce the size of the TFT while securing desired TFT characteristics.

DESCRIPTION OF EMBODIMENTS

First Embodiment

An active matrix substrate according to a first embodiment will be described below with reference to the drawings. As an example, an active matrix substrate in which an SSD circuit and a gate driver are monolithically formed and a source driver is mounted will be described below. It is to be noted that in the active matrix substrate according to the present embodiment, a peripheral circuit including at least one TFT may be monolithically formed.

<Structure of the Active Matrix Substrate>

Figure 1:
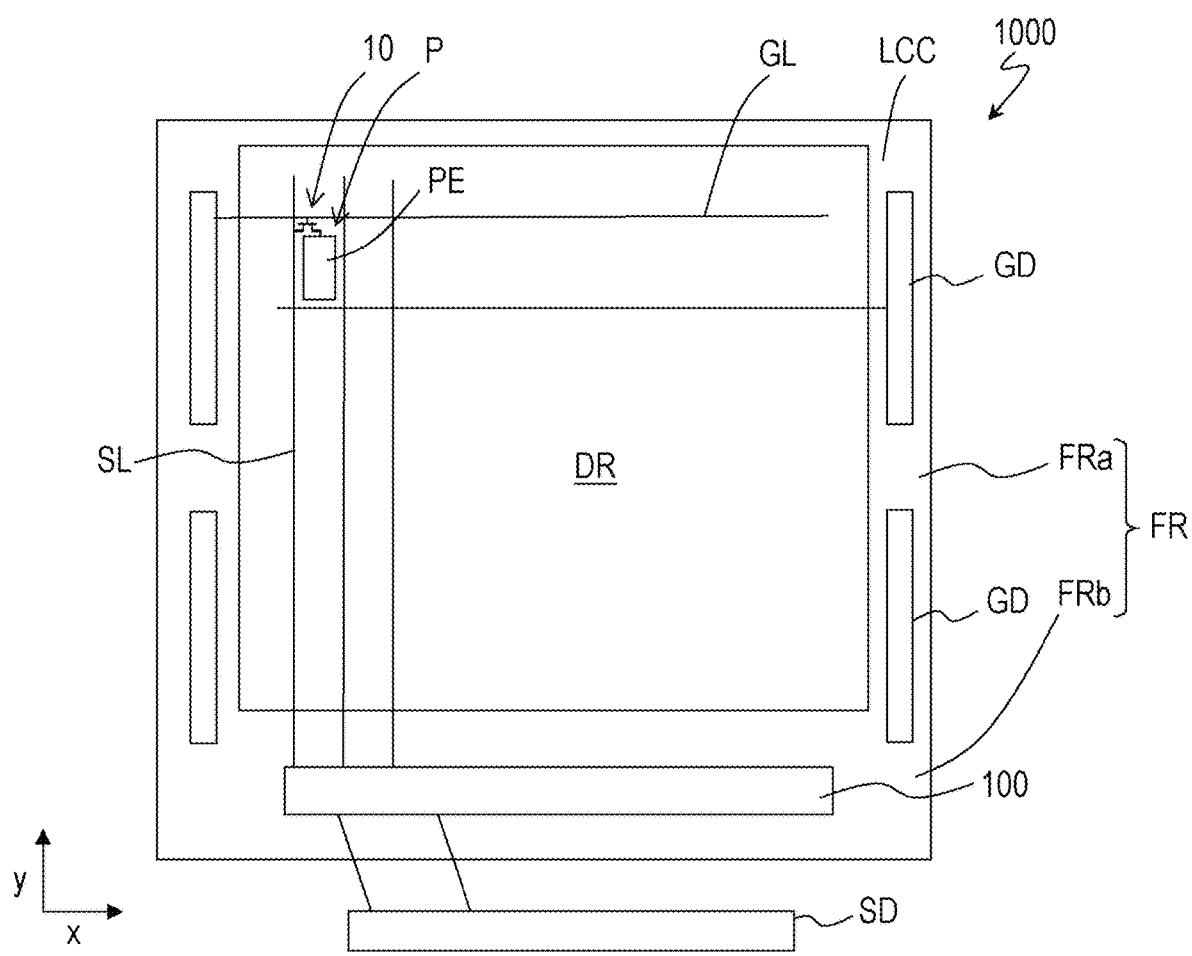
FIG. 1 is a schematic diagram illustrating an example of a planar structure of an active matrix substrate 1000 according to a first embodiment.

FIG. 1 is a schematic diagram illustrating an example of a planar structure of an active matrix substrate 1000 according to the present embodiment.

The active matrix substrate 1000 has a display area DR and an area (a non-display area or a frame area) FR other than the display area DR. The display area DR is configured with pixel areas P that are arranged in a matrix form. The pixel area P (also referred to simply as "pixel" in some cases) is an area that corresponds to a pixel of a display device. The non-display area FR is an area that is positioned in the vicinity of the display area DR and does not contribute to display.

The non-display area FR includes a terminal-portion formation area in which a terminal portion is formed, a drive circuit formation area in which a drive circuit is integrally (monolithically) formed, and the like. For example, a gate driver GD, an SSD circuit 100, and the like are monolithically provided in the drive circuit formation area. A source driver SD, for example, is mounted in the active matrix substrate 1000. In an illustrated example, the gate driver GD is positioned in an area FRa that is positioned on both the sides of the display area DR, and the source driver SD is mounted in an area FRb that is positioned under the display area DR. The SSD circuit 100 is positioned between the display area DR and the source driver SD in the area FRb.

Multiple gate bus lines GL that extend in the row direction (the x direction) and multiple source bus lines SL that extend in the column direction (the y direction) are formed in the display area DR. Each pixel area P, for example, is defined by the gate bus line GL and the source bus line SL. Each of the gate bus lines GL is connected to a corresponding terminal of the gate driver GD. Each of the source bus lines SL is connected to a corresponding terminal of the source driver SD.

Each pixel area P has a TFT (hereinafter, referred to as "pixel TFT") 10 and a pixel electrode PE. A gate electrode of the pixel TFT 10 is electrically connected to the corresponding gate bus line GL, a source electrode thereof is electrically connected to the corresponding source bus line SL. A drain electrode is electrically connected to the pixel electrode PE. In a case where the active matrix substrate 1000 finds application in display devices that operate in a transverse electric field mode such as a Fringe Field Switching (FFS) mode, although not illustrated, an electrode (a common electrode) that is common to multiple pixels is provided in the active matrix substrate 1000.

<Structure of the Circuit TFT>

Figure 2A:
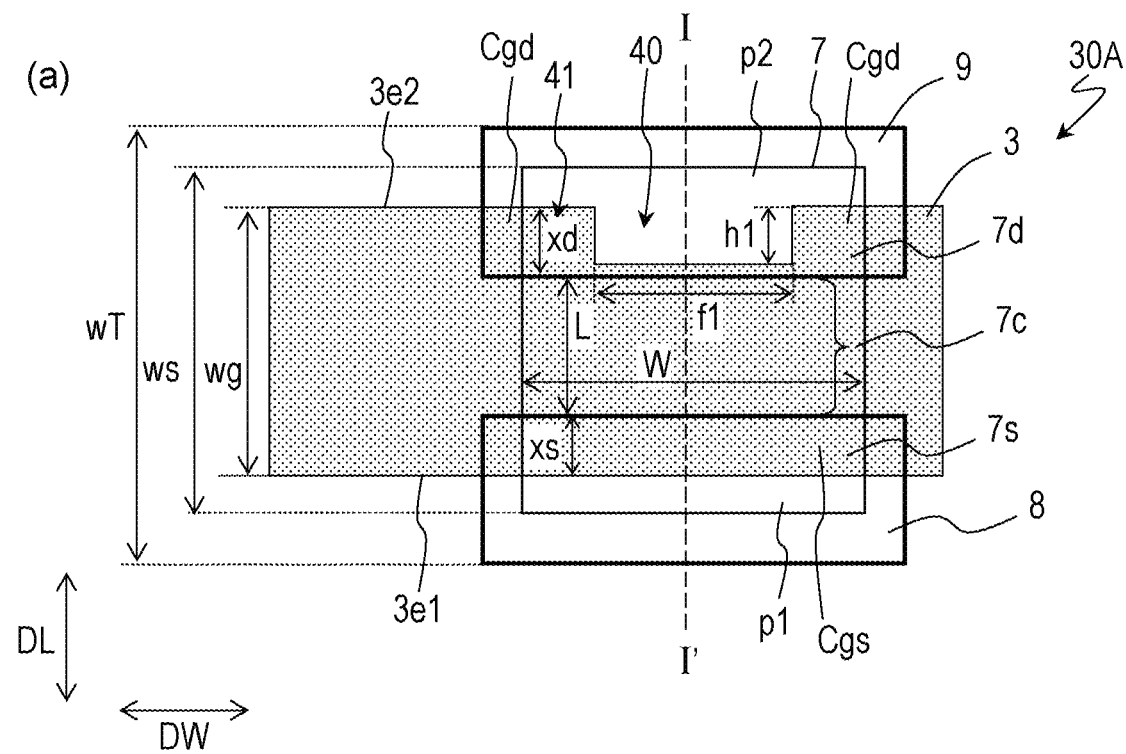
FIGS. 2A(a) and 2A(b) are a plan view and a cross-sectional view, respectively, that illustrate a circuit TFT (thin film transistor 30A) included in peripheral circuits that are monolithically formed in the active matrix substrate 1000.
Figure 2A:
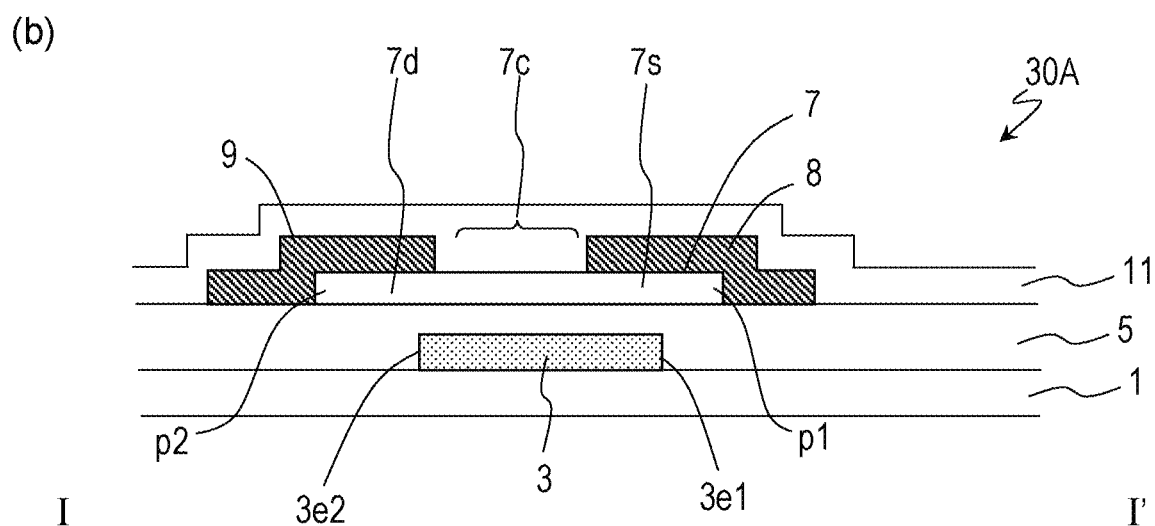

FIGS. 2A(a) and 2A(b) are a plan view and a cross-sectional view, respectively, that illustrate a circuit TFT (thin film transistor 30A) included in peripheral circuits that are monolithically formed in the active matrix substrate 1000 according to the present embodiment. The thin-film transistor 30A can be used as a switching element of the SSD circuit. In addition, the active matrix substrate 1000 according to the present embodiment may have at least one TFT transistor 30A as the circuit TFT and may further have a circuit TFT having a different structure.

The thin-film transistor 30A is supported on the substrate 1 and is formed in a non-display area. The thin-film transistor 30A includes a gate electrode 3 (also referred to as "first gate electrode") disposed on the substrate 1, a gate insulation layer 5 covering the gate electrode 3, an oxide semiconductor layer 7, a source electrode 8, and a drain electrode 9. The oxide semiconductor layer 7 is disposed on the gate insulation layer 5 so as to at least partially overlap with the gate electrode 3 via the gate insulation layer 5.

The source electrode 8 is provided on the oxide semiconductor layer 7 and is in contact with an end p1 of the oxide semiconductor layer 7. The drain electrode 9 is provided on the oxide semiconductor layer 7 and is in contact with an end portion p2 (end portion facing the end p1) of the oxide semiconductor layer 7. In the present specification, in the oxide semiconductor layer 7, a portion in contact with the source electrode 8 is referred to as a source contact area 7*s*, and a portion in contact with the drain electrode 9 is referred to as a drain contact area 7*d*. In the present embodiment, the source contact area 7*s* is disposed at the end portion p1 of the oxide semiconductor layer 7, and the drain contact area 7*d* is disposed at the other end portion p2 positioned on the opposite side across a channel region 7*c*. When viewed in a direction normal to the substrate 1, a region positioned between the source contact area 7*s* and the drain contact area 7*d* and overlaps with the gate electrode 3 is "channel region 7*c*".

In the present specification, in a plane parallel to the substrate 1, a direction DL parallel to the direction in which current flows in the channel region 7c is referred to as "channel length direction", and a direction DW orthogonal to the channel length direction DL is referred to as "channel width direction". The length in the channel length direction DL in the channel region 7c is the channel length L, and the length in the channel width direction DW is the channel width W. In the present embodiment, the channel length direction DL is a direction connecting end portions p1 and p2. From the end portion p1 to the end portion p2, the source contact area 7s, the channel region 7c and the drain contact area 7d are arranged in this order in the channel length direction DL. In addition, as described below, in some cases, current may not flow in one direction in the channel region 7c, depending on the shape of the gate electrode 3 and the arrangement of the oxide semiconductor layer 7 and the drain contact area 7d. In this case, a direction in which end portions p1 and p2 of the oxide semiconductor layer 7 are connected or a direction in which the source contact area 7s and the drain contact area 7d are connected with the shortest distance therebetween is referred to as the channel length direction DL.

The source electrode 8 and the drain electrode 9 may be designed to overlap with the gate electrode 3 when viewed in the direction normal to the substrate 1. The lengths xs and xd of the portions where the source electrode 8 and the drain electrode 9 overlap with the gate electrode 3 can be set in consideration of alignment accuracy.

The gate electrode 3 has a first edge portion 3e1 and a second edge portion 3e2, which face each other, when viewed in the direction normal to the substrate 1. The first edge portion 3e1 and the second edge portion 3e2 generally extend across the oxide semiconductor layer 7 in the channel width direction DW. In the example, the first edge portion 3e1 crosses one end p1 of the oxide semiconductor layer 7, and the second edge portion 3e2 crosses the other end p2 of the oxide semiconductor layer 7. The width wg of the gate electrode 3 in the channel length direction DL is smaller than the width ws of the oxide semiconductor layer 7 in the channel length direction DL.

Further, when viewed in the direction normal to the substrate 1, at least one of the first edge portion 3e1 and the second edge portion 3e2 (here, the second edge portion 3e2) has a recess portion 40 (also referred to as "first recess portion" in some cases) in a region overlapping with the oxide semiconductor layer 7. The recess portion 40 is a portion where the edge portion of the gate electrode 3 is recessed in the channel length direction DL in the plane parallel to the substrate 1. The planar shape of the recess portion 40 is not limited to a rectangular shape as shown. Depending on a method of patterning the gate electrode 3, the recess portion 40 may have a rounded planar shape such as a U-shape. Furthermore, in the present specification, a portion 41 of the gate electrode 3, which overlaps with the oxide semiconductor layer 7 and is adjacent to the recess portion 40 in the channel width direction DW (in this example, parts positioned on both sides of the recess portion 40), is referred to as "first part".

The source electrode 8 or the drain electrode 9 (here, the drain electrode 9) is arranged so as to overlaps with at least part of the recess portion 40 or at least part of the first part 41 of the gate electrode 3 when viewed in the direction normal to the substrate 1. When the source electrode 8 or the drain electrode 9 is designed to overlap with the first part 41 of the gate electrode 3 by the predetermined lengths xs and xd, a predetermined on current can be secured even when misalignment occurs in any direction in the channel length direction DL. In addition, when the source electrode 8 or the drain electrode 9 overlaps with at least part of the recess portion 40 of the gate electrode 3, the gate-source/drain parasitic capacitance can be reduced. In the example, the second edge portion 3e2 has the recess portion 40, and the drain electrode 9 is disposed to overlap with at least part of the recess portion 40 (preferably, the whole recess portion 40). As a result, since the overlap area of the drain electrode 9 and the gate electrode 3 can be reduced, the gate-drain capacitance Cgd can be reduced.

In the present embodiment, the source electrode 8 and the drain electrode 9 is formed using the same conductive layer as the source bus line SL (FIG. 1). The layer formed using the same conductive layer as the source bus line SL is referred to as "source metal layer". In addition, the gate electrode 3 is formed using the same conductive layer as the gate bus line GL (FIG. 1). The layer formed using the same conductive layer as the gate bus line GL is referred to as "gate metal layer".

The thin-film transistor 30A is covered with a protective layer 11 (here, an inorganic insulation layer). The inorganic insulation layer 11 is disposed to be in contact with the upper surfaces of the source electrode 8 and the drain electrode 9 and with the channel region 7c of the oxide semiconductor layer 7.

Hereinafter, effects of the present embodiment will be described in more detail with reference to the drawings.

Figure 15:
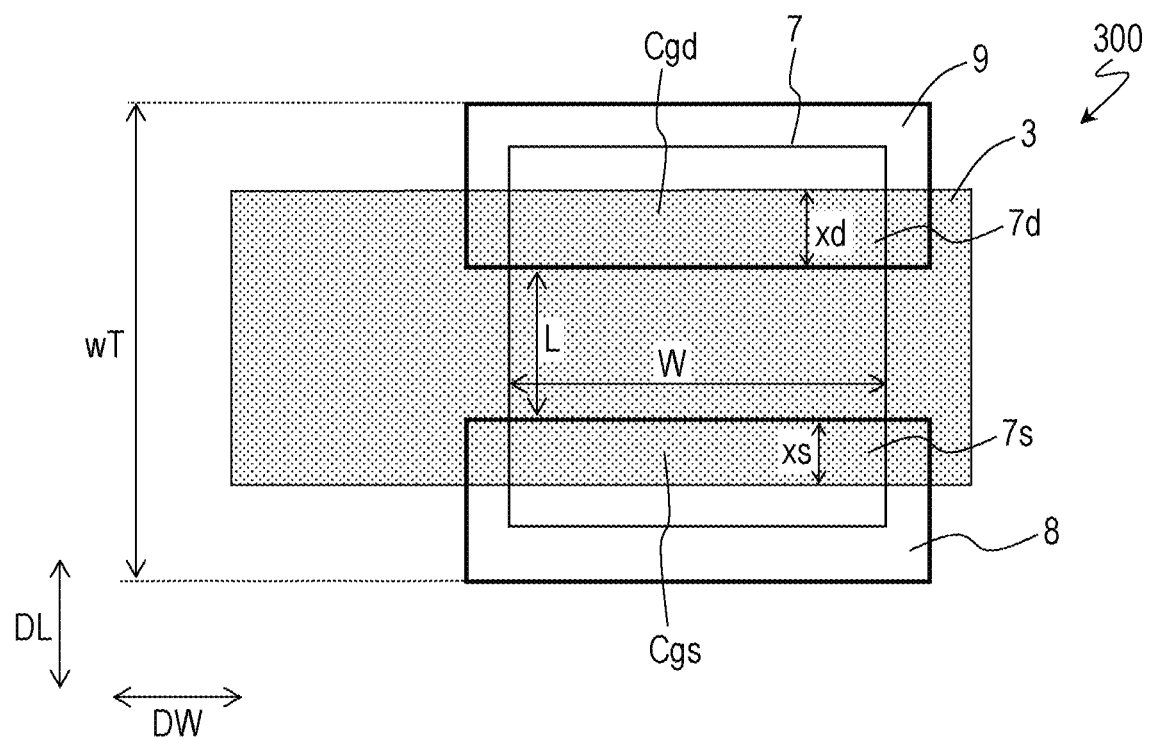
FIG. 15 is a plan view illustrating a thin-film transistor 300 of Reference Example.

FIG. 15 is a plan view illustrating a thin-film transistor 300 of Reference Example. According to the configuration of the thin-film transistor 300, since it is possible to make the width wT (hereinafter, referred to as "TFT width") of the TFT in the channel length direction DL small while securing the channel width W (in the example, the width of the oxide semiconductor layer 7 is the channel width W), the circuit TFT allowing a relatively large current to flow can be used. For example, Japanese Unexamined Patent Application Publication No. 64-84297 discloses that a TFT having such a configuration is used for a demultiplexer of a display device. In the thin-film transistor 300, when viewed in the direction normal to the substrate 1, the gate-source parasitic capacitance Cgs is formed in the portion where the source electrode 8 and the gate electrode 3 overlap with each other, and the gate-drain parasitic capacitance Cgd is formed in the portion where the drain electrode 9 and the gate electrode 3 overlap with each other. The lengths xs, xd (overlap lengths) of the portion where the source electrode 8 and the drain electrode 9 overlaps with the gate electrode 3 can be set in consideration of alignment accuracy. That is, even when alignment occurs in the channel length direction DL, the region (offset region) which does not overlap with any of the gate electrode 3, the source electrode 8, and the drain electrode 9 can be set so as not to be formed in the oxide semiconductor layer 7. However, when the thin-film transistor 300 is further enhanced in definition (that is, the channel length L is further shortened), the ratio of the overlap lengths xs and xd to the channel length L increases, and the parasitic capacitances Cgs and Cgd also increase the influence on the TFT characteristics.

On the other hand, the thin-film transistor 30A (FIG. 2A) according to the present embodiment has the recess portion 40 that is recessed in the channel length direction DL in the first edge portion 3e1 or the second edge portion 3e2 of the gate electrode 3. When viewed in the direction normal to the substrate 1, a part or the whole of the recess portion 40 overlaps with the source electrode 8 or the drain electrode 9. In this way, the overlap area of the gate electrode 3 and the source electrode 8 or the drain electrode 9 is smaller than that of the thin-film transistor 300 by the area of the portion where the recess portion 40 overlaps with the source electrode 8 or the drain electrode 9, and as a result, the gate-source/drain parasitic capacitances Cgd, Cgs can be reduced. Meanwhile, the lengths xs and xd of the portion where the source electrode 8 and the drain electrode 9 overlap with the gate electrode 3 (or a first part 41 of the gate electrode 3) can be set in consideration of alignment accuracy similarly to the thin-film transistor 300. Therefore, the TFT width wT is the same between the thin-film transistor 30A and the thin-film transistor 300. Thus, according to the present embodiment, it is possible to reduce the TFT width wT to the same level as that of the thin-film transistor 300 while suppressing the parasitic capacitances (sum of Cgs and Cgd) smaller than that of the thin-film transistor 300.

Figure 2B:
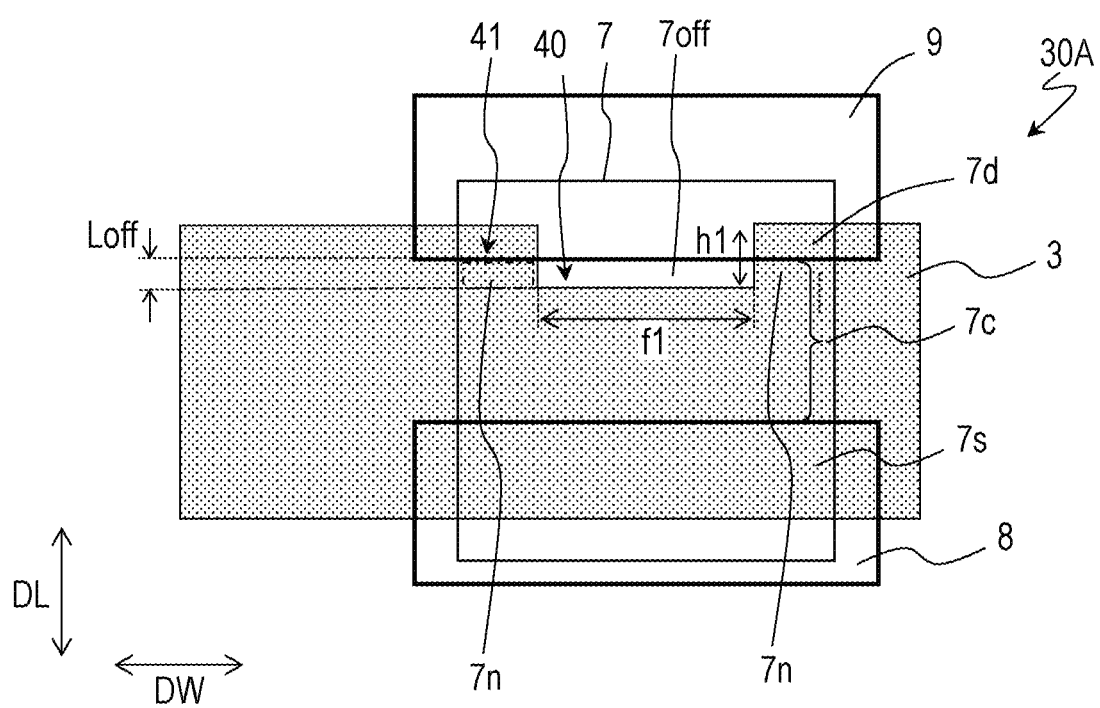
FIG. 2B is a plan view illustrating the thin film transistor 30A when misalignment occurs.

Furthermore, according to the present embodiment, even when misalignment occurs, a predetermined on current can be secured. Therefore, it is possible to reduce the parasitic capacitances Cgd and Cgs while maintaining high reliability. In the thin-film transistor 30A, for example, when misalignment between the gate metal layer and source metal layer occurs in the channel length direction DL, as illustrated in FIG. 2B, the source electrode 8 or the drain electrode 9 (here, drain electrode 9) partially overlaps with the recess portion 40 when viewed in the direction normal to the substrate 1. In this case, an offset region 7off is likely to be present on the oxide semiconductor layer 7. The offset region Toff refers to the area that, when viewed in the direction normal to the substrate 1, is positioned between the channel region 7c and the source electrode 8 and the drain electrode 9 in the oxide semiconductor layer 7 and that does not overlap with any of the source electrode 8, the drain electrode 9 and the gate electrode 3. The width Loff of the offset region Toff in the channel length direction DL is referred to as "offset width". The offset width Loff is equal to or shorter than lengths xd and xs. In general, when the offset region is generated, the offset region has a higher resistance than the channel region in the on state of the TFT. In this way, the on current of the TFT may be reduced. On the other hand, in the present embodiment, the region 7n adjacent to the offset region Toff in the channel width direction DW in the oxide semiconductor layer 7 overlaps with the first part 41 of the gate electrode 3 and can function as the channel region 7c. As described above, since the offset region Toff is not formed across the channel region 7c and the source contact area 7s or the drain contact area 7d in the oxide semiconductor layer 7, it is possible to suppress reduction in the on current caused by the offset region 7off.

The width f1 (the maximum width) of the recess portion 40 may be, for example, 20% or more, preferably 30% or more, of the channel width W of the oxide semiconductor layer 7. This can more effectively reduce the gate-source/drain overlap area. In addition, the width f1 may be 80% or less, preferably 50% or less, of the channel width W of the oxide semiconductor layer 7. Even when the offset region Toff is present due to misalignment, it is possible to effectively suppress reduction in the on current caused by the offset region 7off.

The depth h1 (the maximum step value) of the recess portion 40 in the channel length direction can be preferably set to be less than the overlap lengths xs and sd of the gate electrode 3 and the source electrode 8 or the drain electrode 9 in the channel length direction DL. Therefore, the offset region Toff is less likely to be present, and if present, the region can be formed to be smaller. The lengths xs and xd differ depending on a manufacturing device and the like and are, for example, 1.5 µm or more and 3.0 µm or less. The depth h1 of the recess portion 40 may be equal to or less than, preferably 80% or less of, the channel length L of the oxide semiconductor layer 7 (the minimum value of the distance between the source contact area 7s and the drain contact area 7d). This makes it possible to suppress the parasitic capacitance to a small amount while securing the on current. Meanwhile, the length h1 may be 20% or more, preferably 50% or more, of the channel length L of the oxide semiconductor layer 7. This makes it possible to more effectively reduce the gate-source/drain overlap area.

The thin-film transistor 30A may be a circuit TFT that allows a relatively large current to flow, such as a switching TFT (hereinafter, referred to as an SSD circuit TFT) that is a part of the SSD circuit, and the like. As a result, the width of the circuit TFT (TFT width) in the channel length direction can be reduced while securing the on current by increasing the channel width W of the circuit TFT, and therefore, narrowing of the frame can be implemented. In particular, when the present embodiment is applied to the high definition active matrix substrate having a narrow arrangement pitch of the source bus lines SL (for example, 10 µm or less), it is possible to advantageously dispose the SSD circuit TFT between source bus lines SL adjacent to each other.

The structure of the thin-film transistor 30A is not limited to the example shown in FIG. 2A. For example, the recess portion 40 may be provided only to the first edge portion 3e1 of the gate electrode 3. However, in order to suppress deterioration of the circuit characteristics due to the parasitic capacitance, it is preferable to reduce the gate-drain parasitic capacitance Cgd. In other words, when viewed in the direction normal to the substrate 1, it is preferable to design the overlap area of the drain electrode 9 and the gate electrode 3 to be smaller than the overlap area of the source electrode 8 and the gate electrode 3. Therefore, when the recess portion 40 is provided to only one of the first edge portion 3e1 and the second edge portion 3e2 of the gate electrode 3, it is preferable to provide the recess portion 40 to the second edge portion 3e2 that is positioned on the drain side.

Furthermore, the gate electrode 3 may have the recess portion 40 in both edge portions 3e1 and 3e2 when viewed in the direction normal to the substrate 1. In addition, in one edge portion, two or more recess portions 40 may be arranged at intervals. Furthermore, one edge portion may have a recess portion, and the other edge portion may have a protruding portion. The recess portion 40 and the protruding portion of the gate electrode 3 are not limited to a rectangular shape and may have a rounded shape. Similarly, the planar shapes of the source electrode 8 and the drain electrode 9 are not particularly limited. However, it is preferable that the source electrode 8 and the drain electrode 9 not have a comb structure (see PTL 1). When the structure has a comb shape, the size and the parasitic capacitance of the TFT are increased.

FIG. 3(a) is a plan view illustrating another circuit TFT (a thin film transistor 30B) according to the present embodiment, and FIG. 3(b) is a plan view of the thin film transistor 30B when misalignment occurs.

The thin-film transistor 30B is different from the thin-film transistor 30A in that, when viewed in the direction normal to the substrate 1, both the first edge portion 3e1 and the second edge portion 3e2 of the gate electrode 3 have recess portions 40s and 40d (collectively referred to as "recess portion 40" in some cases) in the region overlapping with the oxide semiconductor layer 7. The source electrode 8 and the drain electrode 9 overlap with at least part of the corresponding recess portions 40. In the illustrated example, the source electrode 8 and the drain electrode 9 overlap with the entire corresponding recess portions 40.

Figure 3:
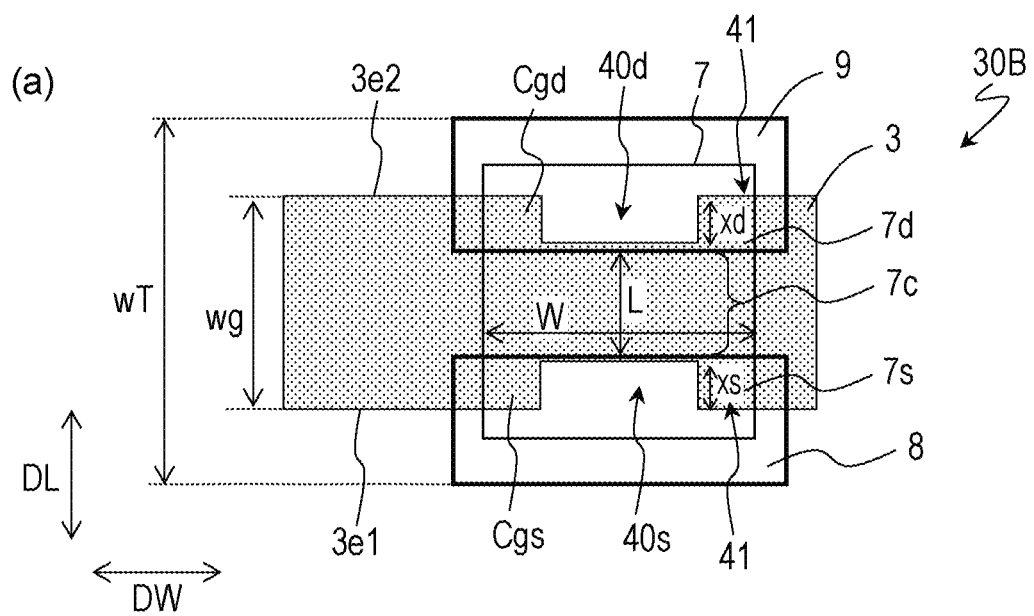
FIG. 3(a) is a plan view illustrating another circuit TFT (a thin film transistor 30B) according to the first embodiment.
FIG. 3(b) is a plan view of the thin film transistor 30B when misalignment occurs.
Figure 3:
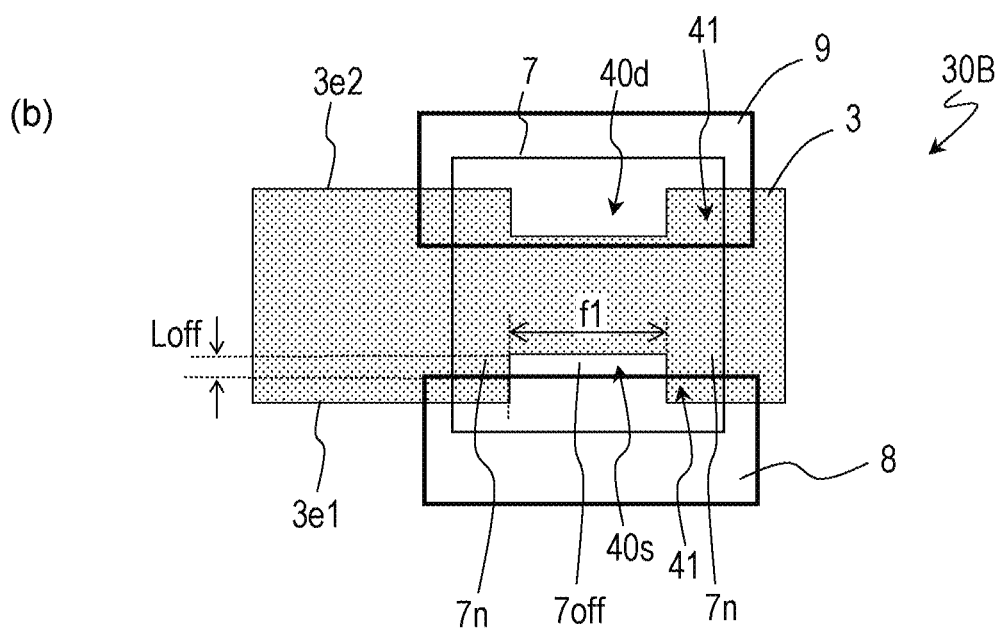

With the configuration described above, not only the gate-drain parasitic capacitance Cgd of the thin-film transistor 30B but also the gate-source parasitic capacitance Cgs can be reduced. Therefore, it is possible to reduce the width wT of the thin-film transistor 30B in the channel length direction DL while suppressing the influence of the parasitic capacitance more effectively. Further, as illustrated in FIG. 3(*b*), even when misalignment occurs in the channel length direction DL and the offset region Toff is present, the region 7*n* adjacent to the offset region Toff in the channel length direction DL overlaps with the first part 41 of the gate electrode 3 and can function as the channel region 7*c*. Therefore, a predetermined on current can be secured.

Figure 4:
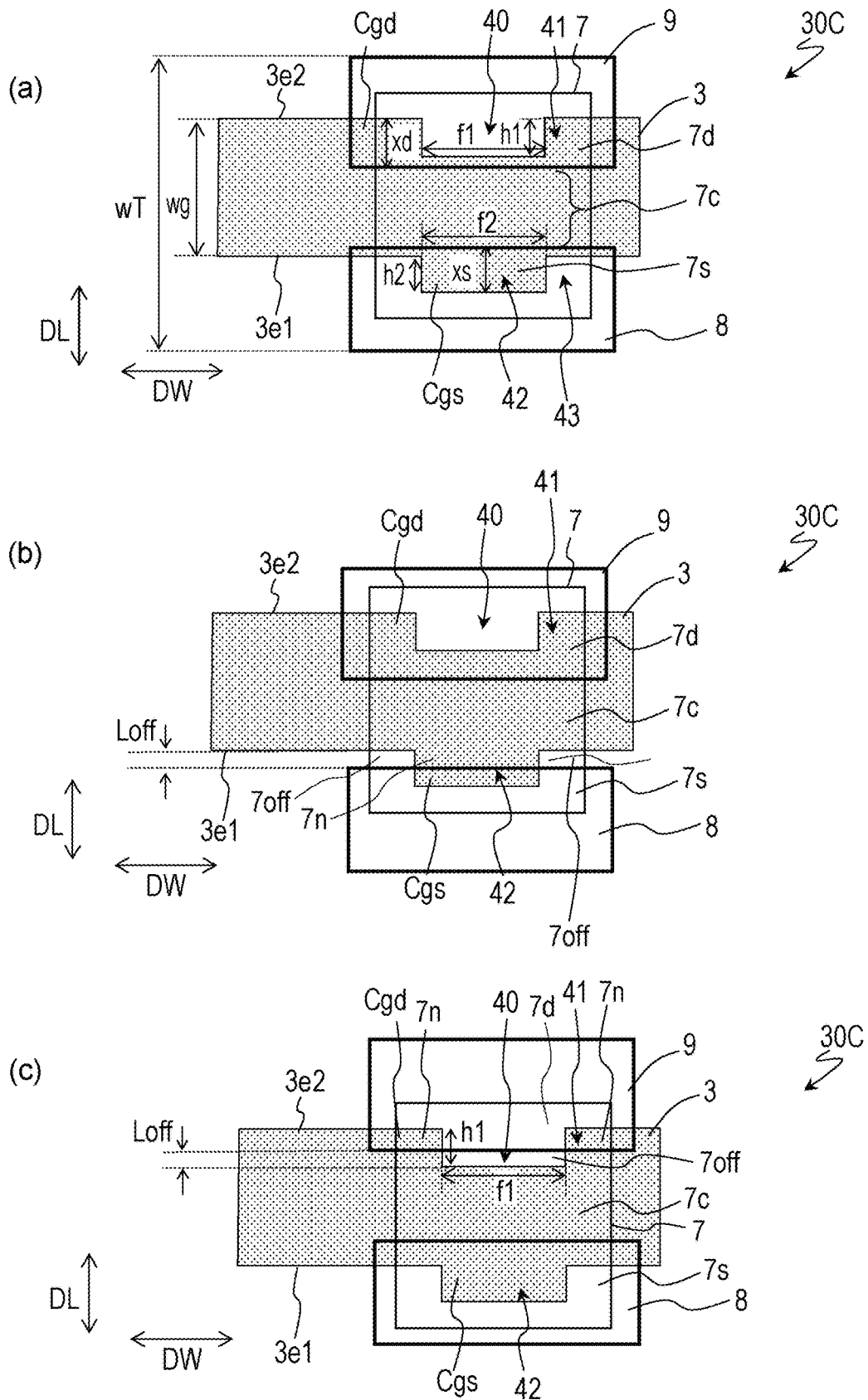
FIG. 4(a) is a plan view illustrating still another circuit TFT (a thin film transistor 30C) according to the first embodiment.
FIG. 4(b) and FIG. 4(c) are plan views of the thin film transistor 30C when respective misalignments occur.

FIG. 4(*a*) is a plan view illustrating still another circuit TFT (a thin film transistor 30C) according to the present embodiment, and FIG. 4(*b*) and FIG. 4(*c*) are plan views of the thin film transistor 30C when respective misalignments occur.

In the thin-film transistor 30C, when viewed in the direction normal to the substrate 1, one of the first edge portion 3*e*1 and the second edge portion 3*e*2 of the gate electrode 3 (here, the second edge portion 3*e*2) has the recess portion 40 in the region overlapping with the oxide semiconductor layer 7, and the other end (here, the first edge portion 3*e*1) has a protruding portion 42 (also referred to as a first protruding portion) in the region overlapping with the oxide semiconductor layer 7. The protruding portion 42 indicates the portion where the edge portion of the gate electrode 3 protrudes in the channel length direction DL in the plain parallel to the substrate 1. In other words, the edge portion of the gate electrode 3 has two notch portions 43 at an interval, and the portion between the notch portions 43 is the protruding portion 42. When viewed in the direction normal to the substrate 1, one (here, the drain electrode 9) of the source electrode 8 and the drain electrode 9 overlaps with at least a part of the recess portion 40 and at least a part of the first part 41, the other (here, the source electrode 8) overlaps with at least a part of the protruding portion 42 and at least a part of the notch portions 43. The source electrode 8 and the drain electrode 9 may overlap with the entire protruding portion 42 or the entire recess portion 40.

With the configuration described above, as compared with a thin-film transistor 300 (FIG. 15) of Reference Example, the overlap area of the gate electrode 3 and the drain electrode 9 can be reduced by the overlap area of the drain electrode 9 and the recess portion 40 of the gate electrode 3, and as a result, the gate-drain parasitic capacitance Cgd can be reduced. Furthermore, since the overlap area of the gate electrode 3 and the source electrode 8 can be reduced by the overlap area of the source electrode 8 and the notch portions 43 of the gate electrode 3, it is also possible to reduce the gate-source parasitic capacitance Cgs.

The height h2 and the width f2 of the protruding portion 42 of the gate electrode 3 can be set in the same range as the width f1 and the h1 of the recess portion 40, respectively. In addition, the length xs of the portion where the source electrode 8 overlaps with the protruding portion 42 of the gate electrode 3, and the length xd of the portion where the drain electrode 9 and the first part 41 of the gate electrode 3 can be set in consideration of the alignment accuracy. Even when misalignment occurs in any direction in the channel length direction DL, the offset region is not present over the entire channel width W, and as a result, a predetermined on current can be secured.

For example, as illustrated in FIG. 4(*b*), when the alignment between the gate metal layer and the source metal layer is shifted in the channel length direction DL, a part of the oxide semiconductor layer 7 may overlap with the notch portion 43 of the gate electrode 3, and the overlapped portion may be the offset region 7off. Even in this case, the region 7*n* positioned between two offset regions Toff overlaps with the protruding portion 42 of the gate electrode 3, and can function as the channel region 7*c*. Therefore, since the offset region Toff is not present across the source contact area 7*s* and the channel region 7*c*, it is possible to suppress reduction in the on current.

Similarly, as illustrated in FIG. 4(*c*), when the alignment between the gate metal layer and the source metal layer is shifted in the opposite direction to that in FIG. 4(*b*), a part of the oxide semiconductor layer 7 may overlap with the recess portion 40 of the gate electrode 3, and the overlapped portion may be the offset region 7off. Even in this case, the region 7*n* positioned on both sides of the offset region Toff overlaps with the first part 41 of the gate electrode 3, and can function as the channel region 7*c*. Therefore, since the offset region Toff is not present across the drain contact area 7*d* and the channel region 7*c*, it is possible to suppress reduction in the on current.

Even with the thin-film transistor 30C, the TFT width wT can be reduced to the same extent as the thin-film transistors 30A, 30B. However, the width wg of the gate electrode 3 of the thin-film transistor 30C in the channel length direction DL is, for example, L+xd (or L+xs), and is smaller than the width wg (L+xd+xs) of the thin-film transistors 30A and 30B.

In the present embodiment, the structure of the circuit TFT is not limited to that described above. For example, in the thin-film transistors 30A to 30C, the sizes of the recess portion 40 and the protruding portion 42 of the gate electrode 3 may be set such that, when viewed in the direction normal to the substrate 1, the overlap area of the drain electrode 9 and the gate electrode 3 is smaller than the overlap area the source electrode 8 and the gate electrode 3. For example, in the thin-film transistor 30B, the width of the recess portion 40*d* of the gate electrode 3 may be larger than the width of the recess portion 40*s*. This makes it possible to further reduce the gate-drain capacitance Cgd.

In the examples illustrated in FIGS. 2A to 4, the recess portion 40 or the protruding portion 42 of the gate electrode 4 is disposed in the vicinity of the center of the channel width W, but the recess portion 40 or the protruding portion 42 may be disposed at a position shifted from the center.

Figure 5:
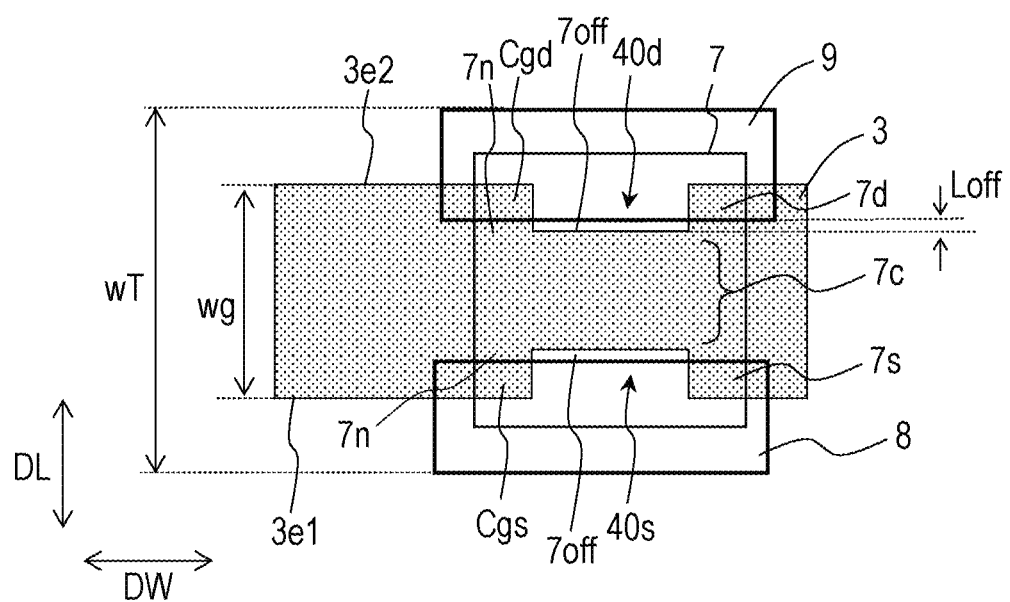
FIG. 5 is a plan view illustrating another circuit TFT according to the first embodiment.

Furthermore, the thin-film transistors 30A to 30C may be designed such that the oxide semiconductor layer 7 has the offset region Toff equal to or less than a predetermined width (for example, the offset width Loff of 2 μm or less) in a region positioned on the recess portion 40 (or notch portion 43) of the gate electrode 3. FIG. 5 is a plan view illustrating a TFT structure in which the offset region Toff is intentionally provided in the thin-film transistor 30B. As described above, the intentional formation of the offset region Toff makes it possible to further reduce the parasitic capacitance while maintaining a predetermined off current.

<TFT Characteristics>

The inventors manufactured a TFT of Comparative Example 1 in which the recess portion was not provided in the gate electrode 3 and a TFT of Example 1 in which the recess portion 40 was provided in the gate electrode 3, and measured Vg-Id characteristics. Hereinafter, the result will be described.

Figure 6A:
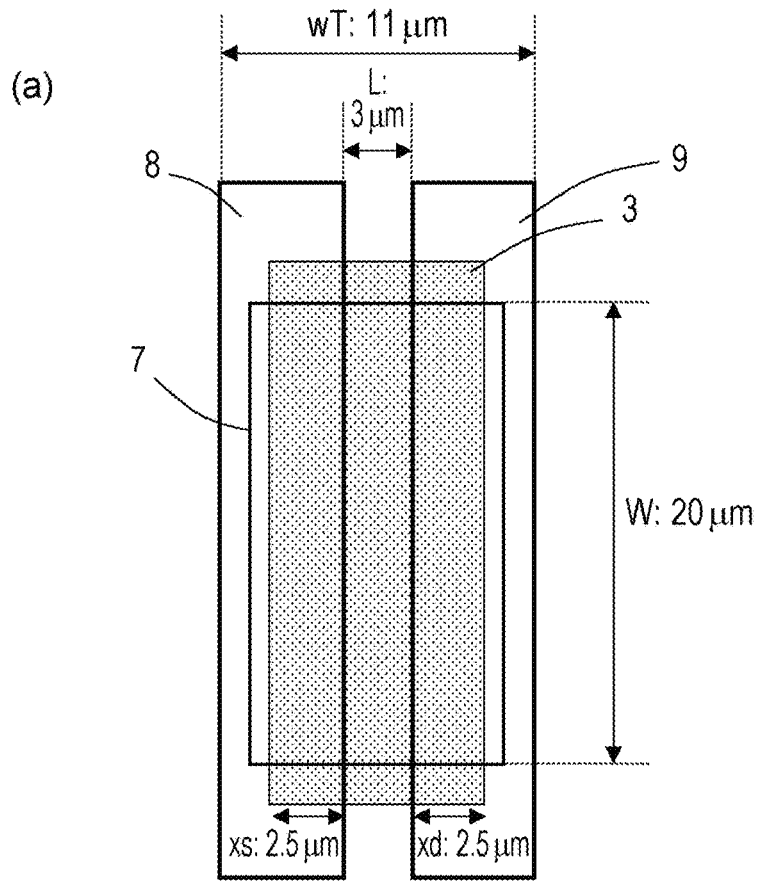
FIGS. 6A(a) and 6A(b) are a plan view of a TFT of Comparative Example 1 and a graph illustrating Vg-Id characteristics of the TFT of Comparative Example 1, respectively.
Figure 6A:
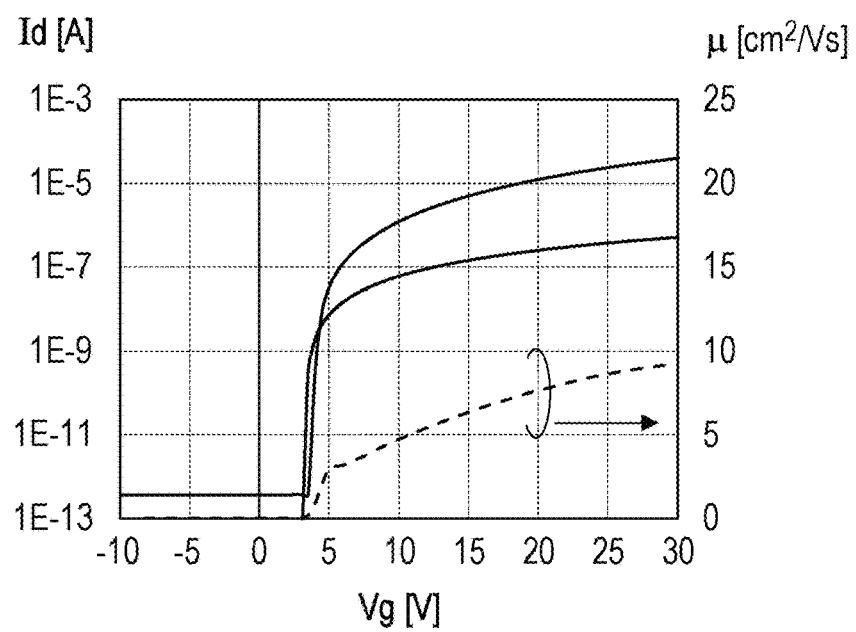
Figure 6B:
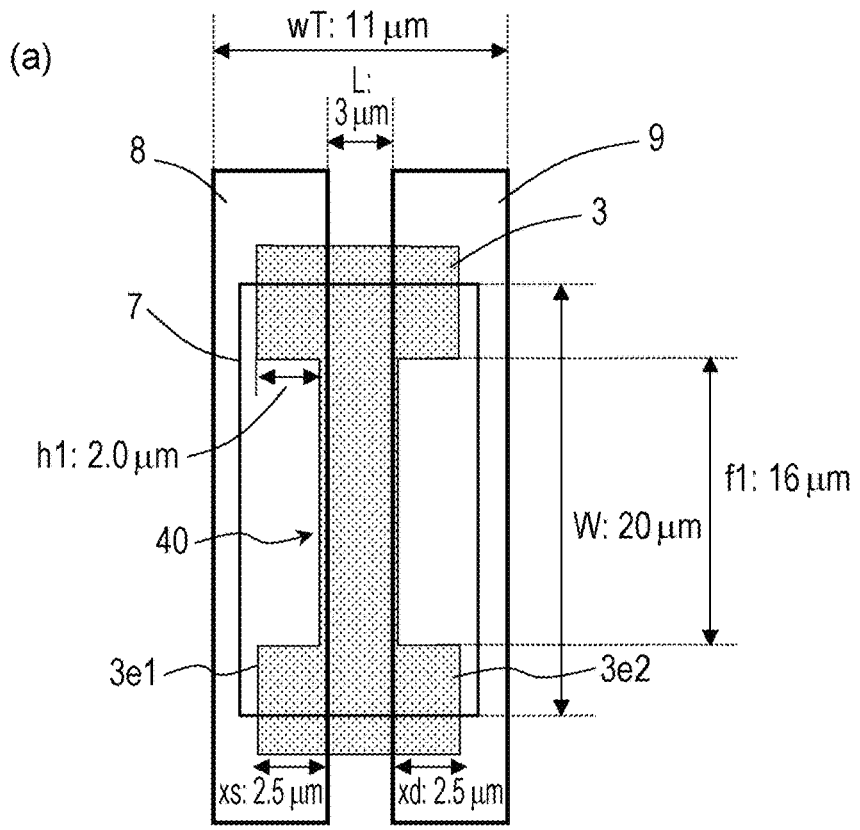
FIGS. 6B(a) and 6B(b) are a plan view of the TFT of Example 1 and a graph illustrating Vg-Id characteristics of the TFT of Example 1, respectively.
Figure 6B:
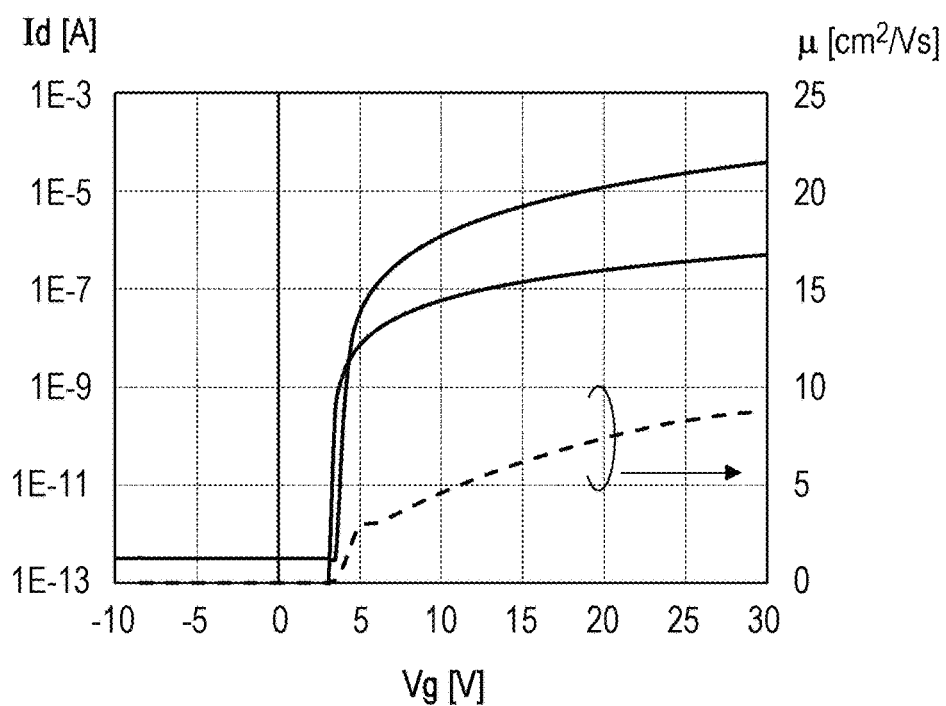

FIGS. 6A(a) and 6A(b) are a plan view of a TFT of Comparative Example 1 and a graph illustrating Vg-Id characteristics of the TFT of Comparative Example 1, respectively. FIGS. 6B(a) and 6B(b) are a plan view of the TFT of Example 1 and a graph illustrating Vg-Id characteristics of the TFT of Example 1, respectively. The TFT of Comparative Example 1 has the configuration similar to the thin-film transistor 300 described above with reference to FIG. 15. The TFT of Example 1 has recess portions 40 at both the first edge portion 3e1 and the second edge portion 3e2 of the gate electrode 3 (which is similar to the thin-film transistor 30B described above with reference to FIG. 4).

Channel lengths L, channel widths W, overlap lengths xs and xd of the gate electrode 3 and the source electrode 8 and the drain electrode 9, and the TFT widths wT of the TFT of Example 1 and the TFT of Comparative Example 1, and the size (width f1 and depth h1) of the recess portion 40 of the TFT of Example 1 are illustrated in FIGS. 6A(a) and 6B(a). The size of the recess portion 40 was set such that the overlap area of the source/drain electrode in the TFT of Example 1 and the gate electrode was approximately 50% of the overlap area of the TFT of Comparative Example 1.

The measurement of Vg-Id characteristics was performed at room temperature using a semi-automatic prober (4156C) device. The gate scan voltage Vg was −10 V to +30 V, and the drain voltage Vd was 0.1 V and 20 V. Further, the field effect mobility μ was calculated from the measurement results of the Vg-Id characteristics of each TFT.

From the results illustrated in FIGS. 6A(b) and 6B(b), it can be seen that the TFTs of Comparative Example 1 and Example 1 have substantially the same performance. Therefore, it is confirmed that even when the gate electrode 3 is provided with the recess portion 40 to reduce the gate-source/drain parasitic capacitances Cgs and Cgd, the predetermined TFT characteristics can be secured.

Next, changes in the on current when the oxide semiconductor layer 7 had the offset region Toff were examined.

Figure 7:
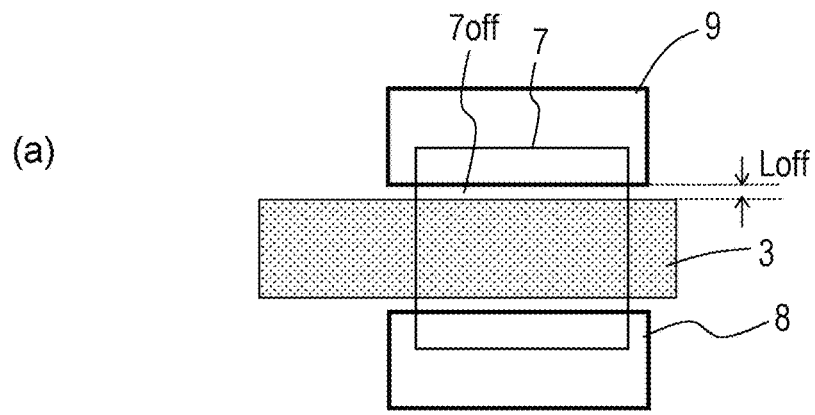
FIGS. 7(*a*) and 7(*b*) are a plan view of a TFT of Comparative Example 2 and a plan view of a TFT of Example 2, respectively, and FIG. 7(*c*) is a graph illustrating a relationship between an offset width Loff and an on current ratio in the TFTs of Comparative Example 2 and Example 2.
Figure 7:
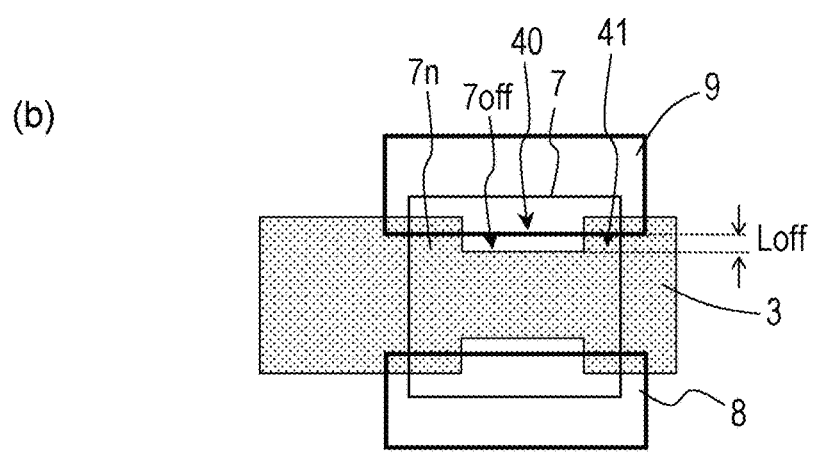
Figure 7:
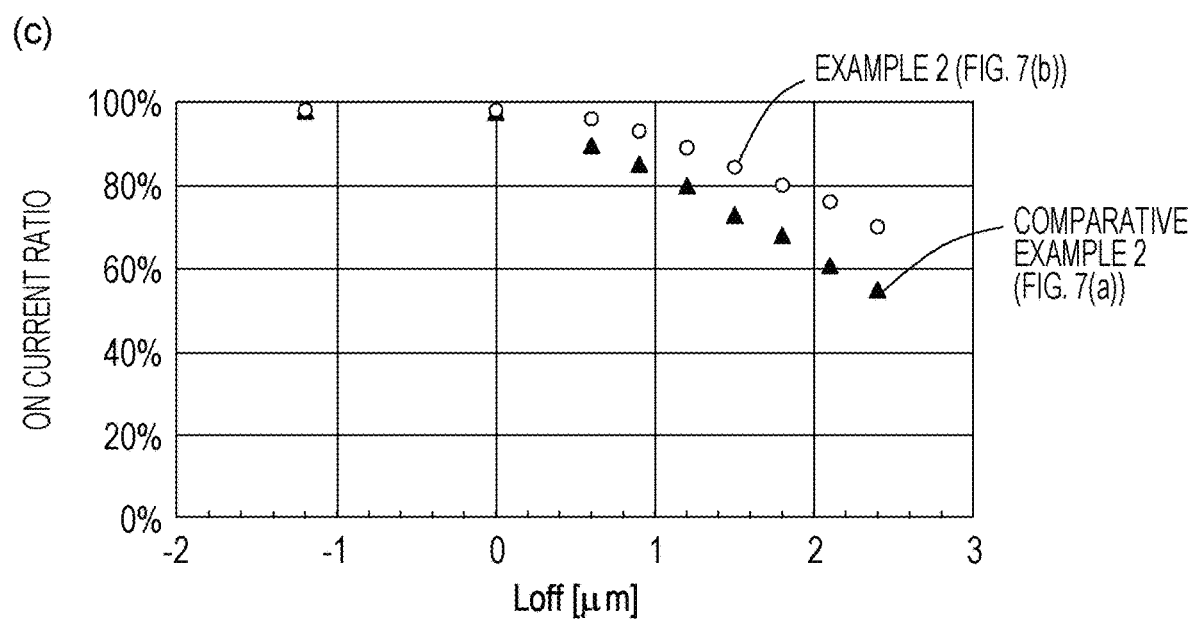

FIGS. 7(a) and 7(b) are a plan view of a TFT of Comparative Example 2 and a plan view of a TFT of Example 2, respectively. The TFTs of Comparative Example 2 and Example 2 are different from the TFTs (FIGS. 6A and 6B) of Comparative Example 1 and Example 1, respectively, in that the offset regions Toff are formed on the source side and the drain side of the oxide semiconductor layer 7. Although, in the TFTs, the offset regions Toff are formed on both the source side and the drain side of the oxide semiconductor layer 7, the offset region Toff may be present on only one of the source side and the drain side when the offset region Toff is present due to misalignment.

Here, a relationship between the offset width Loff and the on current ratio was calculated when the width Loff of the offset region Toff (offset width) is made different by moving the source electrodes 8 and the drain electrodes 9 of the TFTs of Comparative Example 2 and Example 2 in a direction away from the channel region 7c. The result was shown in FIG. 7(c). The horizontal axis represents the offset width Loff, and when the source electrode 8 and the drain electrode 9 overlaps with the gate electrode 3, Loff is expressed as positive, and when the source electrode 8 and the drain electrode 9 overlaps with the gate electrode 3, Loff is expressed as negative. That is, when Loff is positive, it represents the width of the offset region Toff in the channel length direction, and when Loff is negative, it represents the overlap length of the source electrode 8 and the drain electrode 9 and the gate electrode 3. The "on current ratio" on the vertical axis is the ratio to the on current when the offset width Loff is zero.

From the result, it can be seen that, reduction in the on current caused by the offset region Toff can be suppressed in the TFT of Example 2 as compared with the TFT of Comparative Example 2. It is considered that, since the region 7n positioned on both sides of the offset region Toff of the oxide semiconductor layer 7 overlaps with the first part 41 of the gate electrode 3 and can function as the channel region 7c in the TFT of Example 2, the reduction in the on current can be suppressed.

Furthermore, in the TFT of Example 2, it can be seen that the on current ratio is approximately 80% or more when the offset width Loff is less than 2 μm, and approximately 90% or more when the offset width Loff is 1 μm or less. Therefore, it is confirmed that, when the offset width Loff is set to be smaller than a predetermined width in consideration of alignment accuracy, predetermined TFT characteristics can be secured.

Second Embodiment

Hereinafter, with reference to the drawings, a circuit TFT on an active matrix substrate of a second embodiment will be described. In the following description, differences from the first embodiment will be mainly described, and description of the same configuration as that of the first embodiment will be omitted.

The circuit TFT in the second embodiment is different from the circuit TFT in the first embodiment in that the source electrode or the drain electrode has a recess portion or a protruding portion when viewed in the direction normal to the substrate.

Figure 8:
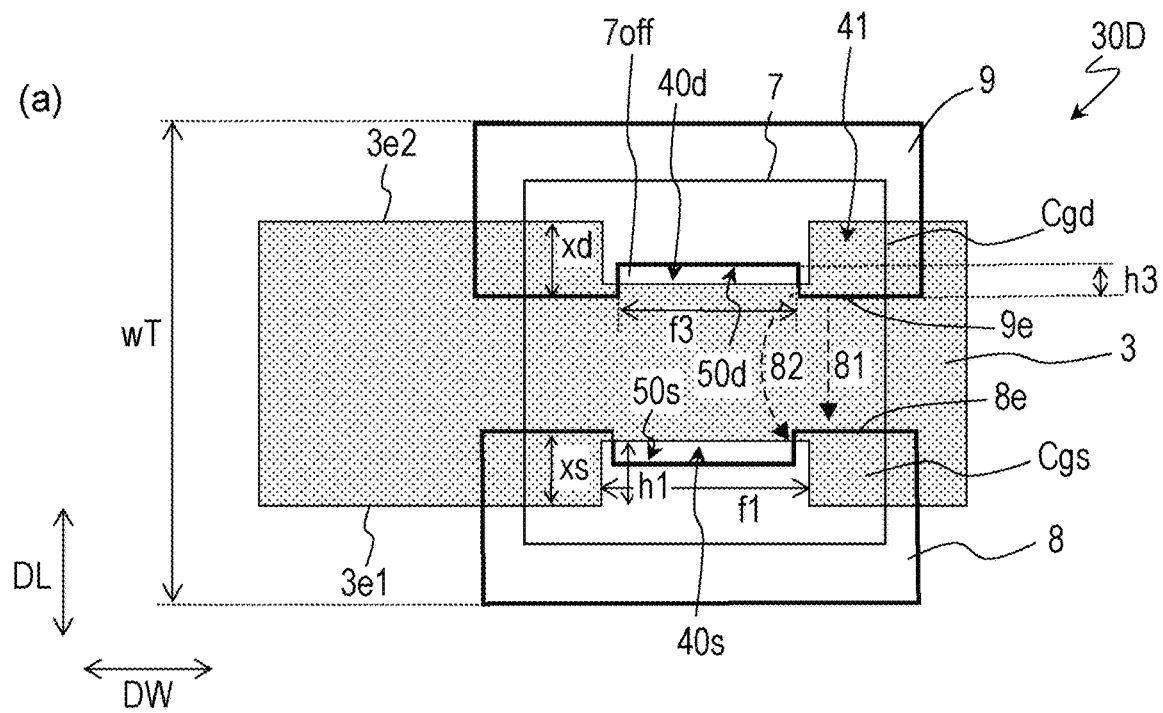
FIGS. 8(*a*) and 8(*b*) are plan views that illustrate circuit TFTs (thin-film transistor 30D, 30E) in a second embodiment, respectively.
Figure 8:
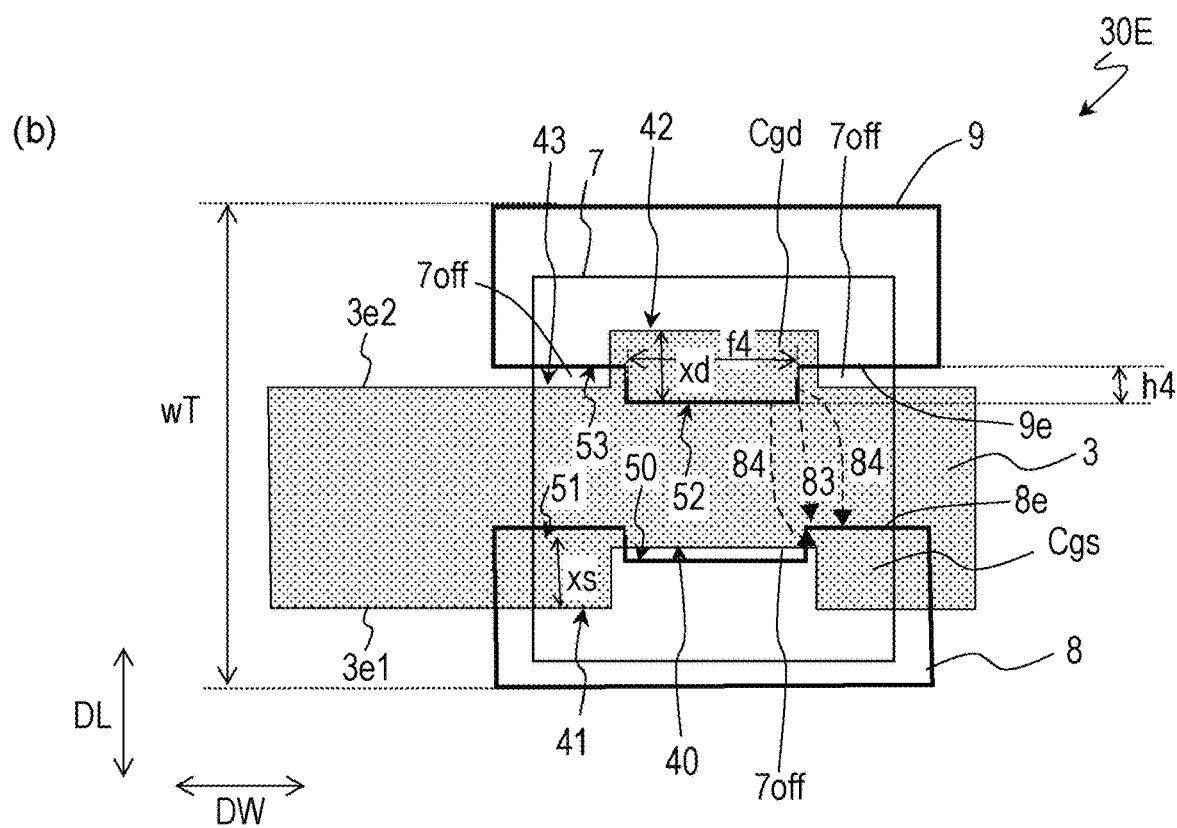

FIGS. 8(a) and 8(b) are plan views that illustrate circuit TFTs (thin-film transistor 30D, 30E) in the second embodiment, respectively. The same components as those in FIGS. 2A to 4 are denoted by the same reference signs.

Source electrodes 8 of the thin-film transistors 30D and 30E have edge portions 8e (hereinafter, referred to as "source edge portions") that opposes drain electrodes 9. Similarly, the drain electrodes 9 have edge portions 9e (hereinafter, referred to as "drain edge portions") that opposes the source electrodes 8. The source edge portion 8e and/or the drain edge portion 9e has a protruding portion 52 (also referred to as "second protruding portion") protruding in the channel length direction DL or a recess portion 50 (also referred to as "second recess portion") recessed in the channel length direction DL, in a region overlapping with the oxide semiconductor layer 7. When viewed in the direction normal to the substrate 1, at least a part of the recess portion 50 or the protruding portion 52 is disposed to overlap with the recess portion 40 of the gate electrode 3.

The thin-film transistor 30D illustrated in FIG. 8(a) is different from the thin-film transistor 30B in that the source edge portion 8e of the source electrode 8 has a recess portion 50s and the drain edge portion 9e of the drain electrode 9 has a recess portion 50d when viewed in the direction normal to the substrate 1. When viewed in the direction normal to the substrate 1, the recess portions 50s and 50d (collectively referred to as "recess portion 50" in some cases) of the source electrode 8 and the drain electrode 9 overlap with at least parts of the recess portions 40s and 40d (collectively referred to as "recess portion 40" in some cases) of the gate electrode 3, respectively. In the oxide semiconductor layer 7, an overlap portion of the recess portion 50s of the source electrode 8 and the recess portion 40s of the gate electrode 3, and an overlap portion of the recess portion 50d of the drain electrode 9 and the recess portion 40d of the gate electrode 3 are offset regions Toff, respectively.

With this configuration, the overlap region of the gate electrode 3 and the source electrode 8 and the drain electrode 9 can be made smaller than the thin-film transistor 30B, which, in turn, makes it possible to further reduce parasitic capacitances Cgd and Cgs between the source/drain electrode and the gate electrode. In addition, even when the offset region Toff is provided, it is possible to make the TFT width wT smaller than the example illustrated in FIG. 5. Furthermore, when misalignment occurs in the channel length direction DL, increase in the overlap area of the gate electrode 3 and the source electrode 8 and the drain electrode 9 is suppressed more than the thin-film transistor 30B.

The depth h1 of the recess portion 40 of the gate electrode 3 and the depth h3 of the recess portion 50 of the source electrode 8 and the drain electrode 9 may be set such that the width Loff of the offset region Toff is, for example, 2 μm or less. This makes it possible to more reliably suppress reduction in the on current caused by the offset region 7off. The depth h3 of the recess portion 50 may be smaller than the depth h1 of the recess portion 40. The width f3 of the recess portion 50 of the source electrode 8 and the drain electrode 9 may be set within the same range as the width f1 of the recess portion 40 of the gate electrode 3.

As illustrated, the width f3 of the recess portion 50 of the source electrode 8 and the drain electrode 9 may be smaller than the width f1 of the recess portion 40 of the gate electrode 3. In this case, the side wall portion of the recess portions 50 of the source electrode 8 and the drain electrode 9 are disposed on the channel region 7c. This allows current not only to flow linearly as indicated by arrow 81, but also to flow curvilinearly by the side wall portions of the recess portions 50s and 50d as indicated by arrow 82. As a result, reduction in the on current caused by the offset region Toff can be more effectively suppressed.

Furthermore, in FIG. 8(a), the recess portion 50 is provided in both the source electrode 8 and the drain electrode 9, but may be provided at only one of them. The gate electrode 3 may have the recess portion 40 below the source electrode 8 or the drain electrode 9, and may have the recess portion 40 at only one of the first edge portion 3e1 and the second edge portion 3e2.

In the thin-film transistor 30E illustrated in FIG. 8(b), the gate electrode 3 has the protruding portion 42 at one of the first edge portion 3e1 and the second edge portion 3e2, and the recess portion 40 at the other of the first edge portion 3e1 and the second edge portion 3e2, in the region overlapping with the oxide semiconductor layer 7, when viewed in the direction normal to the substrate 1. In addition, one (here, the drain edge portion 9e) of the source edge portion 8e of the source electrode 8 and the drain edge portion 9e of the drain electrode 9 has the protruding portion 52, and the other (here, source edge portion 8e) has the recess portion 50. In the example, the drain edge portion 9e has two notch portions 53 disposed at an interval, and the portion positioned between the notch portions 53 is the protruding portion 52. When viewed in the direction normal to the substrate 1, the protruding portion 52 of the drain electrode 9 overlaps with at least a part of the recess portion 40 of the gate electrode 3, and the recess portion 50 of the source electrode 8 overlaps with at least a part of the protruding portion 42 of the gate electrode 3. In the oxide semiconductor layer 7, the overlap portion of the recess portion 50 of the source electrode 8 and the recess portion 40 of the gate electrode 3, and the overlap portion of the notch portion 53 of the drain electrode 9 and the notch portion 43 of the gate electrode 3 are offset regions Toff, respectively.

With this configuration, since the overlap area of the gate electrode 3 and the source electrode 8 and the drain electrode 9 can be made smaller than that of the thin-film transistor 30C, it is possible to reduce the parasitic capacitances Cgd, Cgs between the source/drain electrodes and the gate electrode. In addition, when misalignment occurs in the channel length direction DL, increase in the overlap area of the gate electrode 3 and the source electrode 8 or the drain electrode 9 is suppressed more than the thin-film transistor 30C.

The depth h1 of the recess portion 40 and the height h2 of the protruding portion 42, of the gate electrode 3, and the depth h3 of the recess portion 50 and the height h4 of the protruding portion 52, of the source electrode 8 or the drain electrode 9, may be set such that the width Loff of the offset region Toff is, for example, less than 2 μm. This makes it possible to more reliably suppress reduction in the on current caused by the offset region 7off. The depth h3 of the recess portion 50 may be smaller than the depth h1 of the recess portion 40. In addition, the height h4 of the protruding portion 52 may be smaller than the height h2 of the protruding portion 42. The widths f3 and f4 of the recess portion 50 and the protruding portion 52 of the source electrode 8 or the drain electrode 9 may be set within the same range as the widths f1 and f2 of the recess portion 40 and the protruding portion 42 of the gate electrode 3.

As illustrated, the widths f3 and f4 of the recess portion 50 and the protruding portion 52 of the source electrode 8 and the drain electrode 9 may be smaller than the widths f1 and f2 of the recess portion 40 and the protruding portion 42 of the gate electrode 3. In this case, the side wall portions of the recess portion 50 and the protruding portion 52 of the source electrode 8 and the drain electrode 9 are disposed on the channel region 7c. This allows current not only to flow linearly as indicated by arrow 83, but also to flow curvilinearly by the side wall portions of the recess portion 50 and the protruding portion 52 as indicated by arrow 84. As a result, reduction in the on current caused by the offset region Toff can be more effectively suppressed.

In the gate electrode 3, the protruding portion 42 may be provided at the first edge portion 3e1 and the recess portion 40 may be provided at the second edge portion 3e2. The protruding portion 52 may be provided at the source electrode 8 and the recess portion 50 may be provided at the drain electrode 9.

Third Embodiment

Hereinafter, with reference to the drawings, a circuit TFT on an active matrix substrate of a third embodiment will be described. In the following description, differences from the first embodiment will be mainly described, and description of the same configuration as that of the first embodiment will be omitted.

The circuit TFT in the third embodiment is different from the circuit TFT in the first embodiment in that it has gate electrodes on the side of the substrate 1 of the oxide semiconductor layer 7 and on the side opposite to the substrate 1, respectively (double gate configuration).

FIGS. 9(a) and 9(b) are a plan view and a cross-sectional view that illustrate the circuit TFT (thin-film transistor 30F) of the present embodiment, respectively.

The thin-film transistor 30F also has another gate electrode 23 (hereinafter, referred to as "upper gate electrode", and in some cases, referred to as "second gate electrode") above the oxide semiconductor layer 7, that is, on the side opposite to the substrate 1 of the oxide semiconductor layer 7. Other structures are similar to, for example, the thin-film transistor 30B illustrated in FIG. 3.

The upper gate electrode 23 is disposed on the oxide semiconductor layer 7 via an insulation film. When viewed in the direction normal to the substrate 1, the upper gate electrode 23 at least partially overlaps with the oxide semiconductor layer 7. In the example, the thin-film transistor 30F is covered with the inorganic insulation layer 11 (passivation layer), and the upper gate electrode 23 is disposed on the inorganic insulation layer 11. That is, the inorganic insulation layer 11 also serves as a gate insulation film of the upper gate electrode 23. In the present embodiment, the gate insulation film positioned between the oxide semiconductor layer 7 and the gate electrode 3 and the gate insulation film positioned between the oxide semiconductor layer 7 and the upper gate electrode 23 are distinguished by being referred to as "first gate insulation film" and "second gate insulation film", respectively. The upper gate electrode 23 is disposed to partially overlap with the source electrode 8 and the drain electrode 9 when viewed in the direction normal to the substrate 1. The length of the overlap portion in the channel length direction DL may be the same as the overlap lengths xd and xs of the gate electrode 3 and the source electrode 8 and the drain electrode 9.

The upper gate electrode 23 may be, for example, a transparent electrode formed using the same transparent conductive layer as the transparent electrode (for example, pixel electrode) disposed in the display area. In the active matrix substrate applied to a display device that operates in the transverse electric field mode, a lower transparent electrode and an upper transparent electrode are disposed on the display area via a dielectric layer. One of the lower transparent electrode and the upper transparent electrode is a pixel electrode, and the other is a common electrode. In this case, the upper gate electrode 23 can be formed using the same transparent conductive film as the lower transparent electrode or the upper transparent electrode. When the upper gate electrode 23 is formed using the same transparent conductive film as the lower transparent electrode, the inorganic insulation layer 11 which is a passivation film can function as a second gate insulation film. When the upper gate electrode 23 is formed using the same transparent conductive film as the upper transparent electrode, the inorganic insulation layer 11 and the dielectric layer 17 can function as a second gate insulation film.

Figure 9:
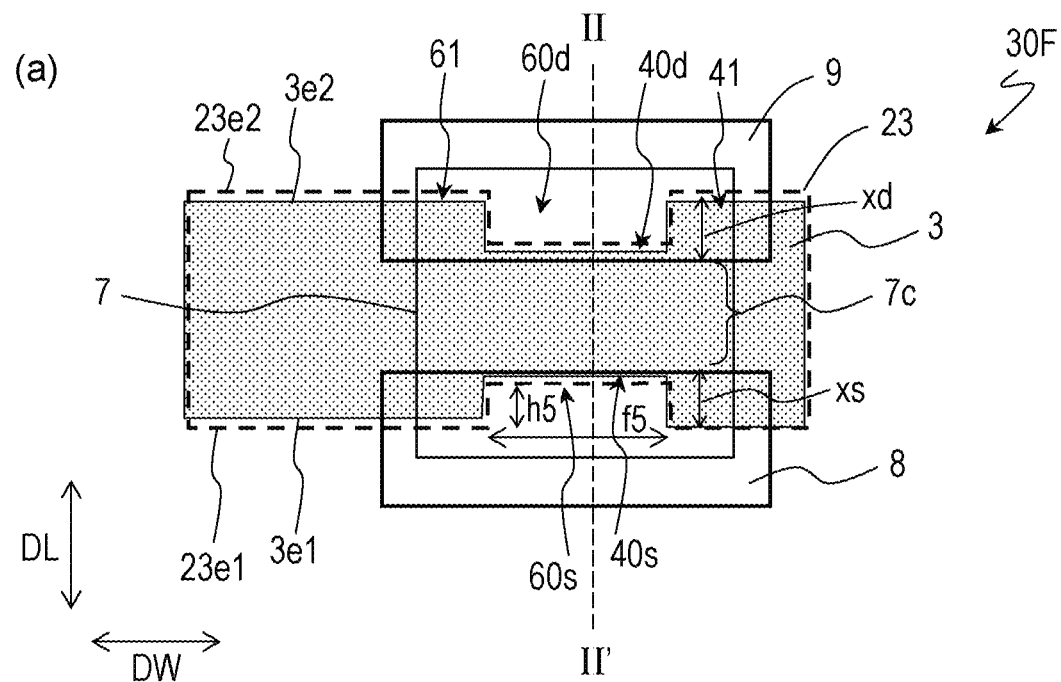
FIGS. 9(*a*) and 9(*b*) are a plan view and a cross-sectional view that illustrate a circuit TFT (thin-film transistor 30F) of a third embodiment, respectively.
Figure 9:
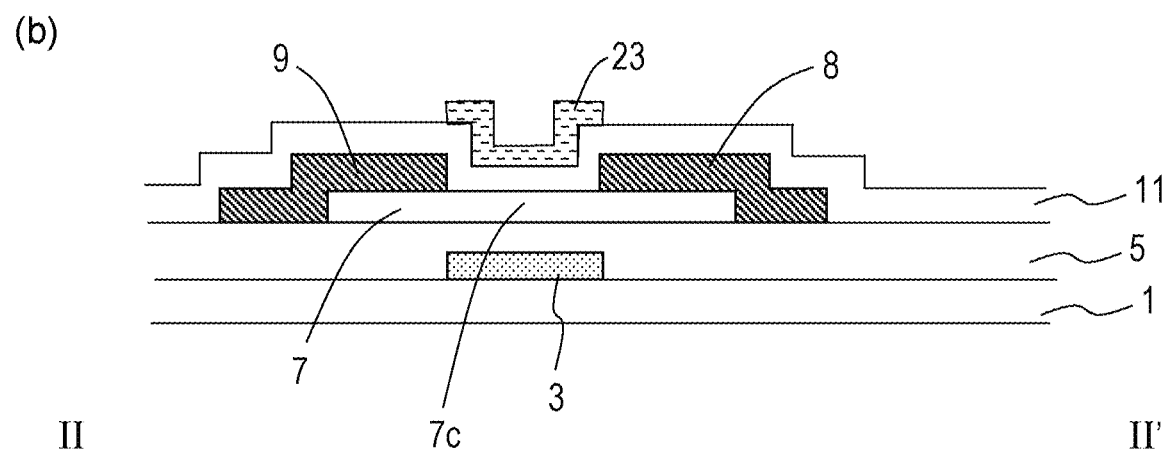

In the example illustrated in FIG. 9, the upper gate electrode 23 has the same planar shape as the gate electrode 3. That is, the upper gate electrode 23 may have recess portions (also referred to as "third recess portions") 60s and 60d (collectively referred to as "recess portion 60" in some cases) at positions corresponding to the recess portions 40s and 40d (collectively referred to as "recess portion 40" in some cases) of the gate electrode 3. More specifically, when viewed in the direction normal to the substrate 1, the upper gate electrode 23 has an edge portion 23e1 (also referred to as "third edge portion") and an edge portion 23e2 (also referred to as "fourth edge portion") that oppose each other, and the edge portions 23e1 and 23e2 extend across the oxide semiconductor layer 7 in the channel width direction DW. When viewed in the direction normal to the substrate 1, the edge portions 23e1 and 23e2 have recess portions 60s and 60d recessed in the channel length direction DL, and a second part 61 adjacent to the recess portions 60s and 60d in the channel width direction DW, in the region overlapping with the oxide semiconductor layer 7. When viewed in the direction normal to the substrate 1, the recess portion 60s and the recess portion 40s at least partially overlap with each other, and the recess portion 60d and the recess portion 40d at least partially overlap with each other.

The source electrode 8 and the drain electrode 9 at least partially overlap with the recess portion 40 and the first part 41 of the gate electrode 3, and at least partially overlap with the recess portion 60 and the second part 61 of the gate electrode 23, respectively. Since the overlap area of the upper gate electrode 23 and the source electrode 8 and the drain electrode 9 is reduced by the overlap area of the recess portion 60 of the upper gate electrode 23 and the source electrode 8 and the drain electrode 9, it is possible to suppress the parasitic capacitances to be smaller than the case where the recess portion is not formed at the upper gate electrode 23.

Since the thin-film transistor 30F according to the present embodiment has the gate electrode 3 and the upper gate electrode 23, that is, a double gate structure, the thin-film transistor 30F can increase the on current more than the TFT having a single gate structure, and can implement higher electric current drive force. Further, according to the present embodiment, the parasitic capacitance between the gate electrode 3 and the source electrode 8 and the drain electrode 9 and the parasitic capacitance between the upper gate electrode 23 and the source electrode 8 and the drain electrode 9 are reduced, and thus the size (width wT in the channel length direction DL) of the thin film transistor 30F can be reduced. Further, even when misalignment occurs, a predetermined on current can be secured, such that the parasitic capacitance can be reduced while maintaining high reliability.

The width f5 and the depth h5 of the recess portion 60 of the upper gate electrode 23 can be set within the same range as the width f1 and the depth h1 of the recess portion 40 of the gate electrode 3, respectively. The width f5 may be the same as the width f1 or may be smaller than the width f1. This makes it possible more effectively suppress increase in parasitic capacitance. The depth h5 may be the same as the depth h1 of the recess portion 40 of the gate electrode 3 or may be smaller than the depth h1. As illustrated, when viewed in the direction normal to the substrate 1, the recess portion 60 and the recess portion 40 may be designed to be substantially aligned.

In FIG. 9, the recess portion 60 is provided to both of the two edge portions 23e1 and 23e2 of the upper gate electrode 23, but may be provided to only one of them. The gate electrode 3 may have the recess portion 40 at least below the recess portion of the upper gate electrode 23, and may have the recess portion 40 only at one of the first edge portion 3e1 and the second edge portion 3e2.

FIGS. 10(a) and 10(b) are a plan view and a cross-sectional view that illustrate another circuit TFT (thin-film transistor 30G) of the third embodiment, respectively.

The thin-film transistor 30G is different from the thin-film transistor 30F illustrated in FIG. 9 in that the upper gate electrode 23 has a planar shape different from the gate electrode 3. In the thin-film transistor 30G, the upper gate electrode 23 has protruding portions (also referred to as "third protruding portions") 62s, 62d (collectively referred to as "protruding portion 62" in some cases) protruding in the channel length direction DL at positions corresponding to the recess portions 40 of the gate electrode 3, respectively. In the example, when viewed in the direction normal to the substrate 1, at least one (here, both) of the edge portion 23e1 and the edge portion 23e2 of the upper gate electrode 23 has the protruding portion 62 protruding in the channel length direction DL in the region overlapping with the oxide semiconductor layer 7 when viewed in the direction normal to the substrate 1. In other words, in the edge portions 23e1 and 23e2, two notch portions 63 are disposed at an interval in the region overlapping with the oxide semiconductor layer 7, and the portion positioned between the notch portions 63 is the protruding portion 62.

When viewed in the direction normal to the substrate 1, the protruding portion 62 of the upper gate electrode 23 and the recess portion 40 of the gate electrode 3 at least partially overlap with each other. The source electrode 8 and the drain electrode 9 at least partially overlap with the recess portion 40s and the first part 41 of the gate electrode 3, and at least partially overlap with the protruding portion 62s and the notch portions 63 of the upper gate electrode 23. Since the overlap area of the drain electrode 9 and the source electrode 8 of the upper gate electrode 23 is reduced by the overlap area of the notch portions 63 of the upper gate electrode 23 and the source electrode 8 and the drain electrode 9, it is possible to suppress the parasitic capacitance to be small as compared with the case where the protruding portion is not formed at the upper gate electrode 23.

Since the thin-film transistor 30G has a gate electrode 3 and the upper gate electrode 23, that is, a double gate structure, higher current drive force can be implemented. Further, according to the configuration, it is possible to reduce the parasitic capacitance between the gate electrode 3 and the source electrode 8 and the drain electrode 9 and the parasitic capacitance between the upper gate electrode 23 and the source electrode 8 and the drain electrode 9 and to reduce the size (width wT in the channel length direction DL) of the thin-film transistor 30F.

Further, in the thin-film transistor 30G, it is possible to more effectively suppress reduction in the on current when misalignment occurs in the channel length direction DL. As illustrated in FIG. 10(c), when misalignment between the gate metal layer and the source metal layer occurs, a region 70 which does not overlap with any of the gate electrode 3, the source electrode 8, and the drain electrode 9 may be formed at a portion of the oxide semiconductor layer 7 positioned on the recess portion 40 when viewed in the direction normal to the substrate 1. Even in this case, the region 70 overlaps with the protruding portion 62 of the upper gate electrode 23, and as a consequence, can function as the channel region 7c instead of being an offset region. Therefore, even when misalignment occurs, a predetermined on current can be secured more reliably.

The width f6 and the height h6 of the protruding portion 62 of the upper gate electrode 23 can be set to be within the same range as the width f1 and the height h1 of the recess portion 40 of the gate electrode 3. The width f6 may be the same as the width f1 of the recess portion 40 of the gate electrode 3, or may be smaller than the width f1. This makes it possible to more effectively suppress increase in the parasitic capacitance. The height h6 may be the same as the depth h1 of the recess portion 40 of the gate electrode 6, or may be smaller than the depth h1. As illustrated, when viewed in the direction normal to the substrate 1, the protruding portion 62 and the recess portion 40 may be designed to be substantially aligned.

Figure 10:
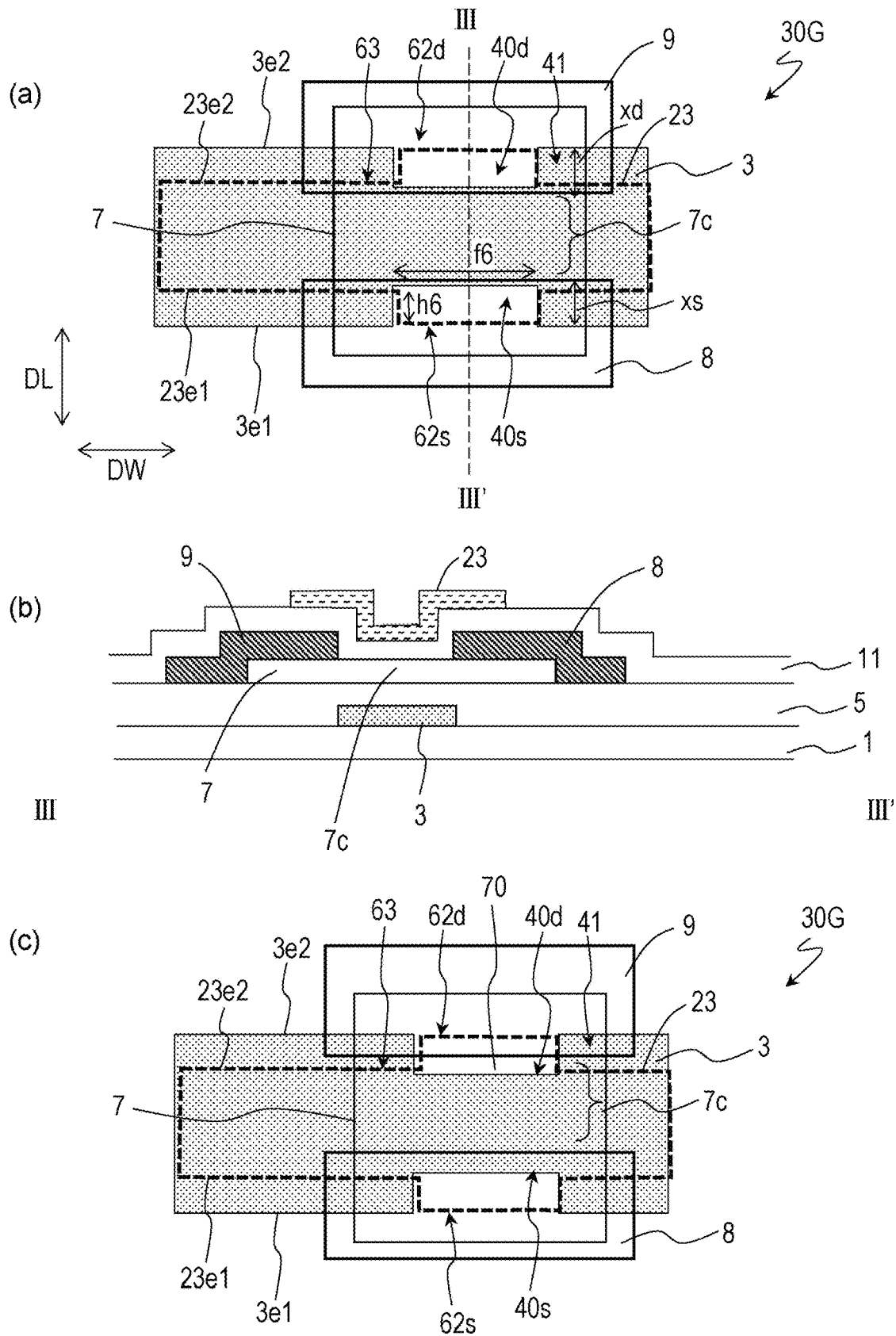
FIGS. 10(*a*) and 10(*b*) are a plan view and a cross-sectional view that illustrate another circuit TFT (thin-film transistor 30G) of the third embodiment, respectively, and FIG. 10(*c*) is a plan view of the thin-film transistor 30G when misalignment occurs.

In FIG. 10, in the upper gate electrode 23, the recess portion 60 is provided to both of the two edge portions 23e1 and 23e2, but may be provided at only one of them. The gate electrode 3 may have the recess portion 40 at least below the recess portion 60 of the upper gate electrode 23, and may have the recess portion 40 at only one of the first edge portion 3e1 and the second edge portion 3e2.

Figure 11:
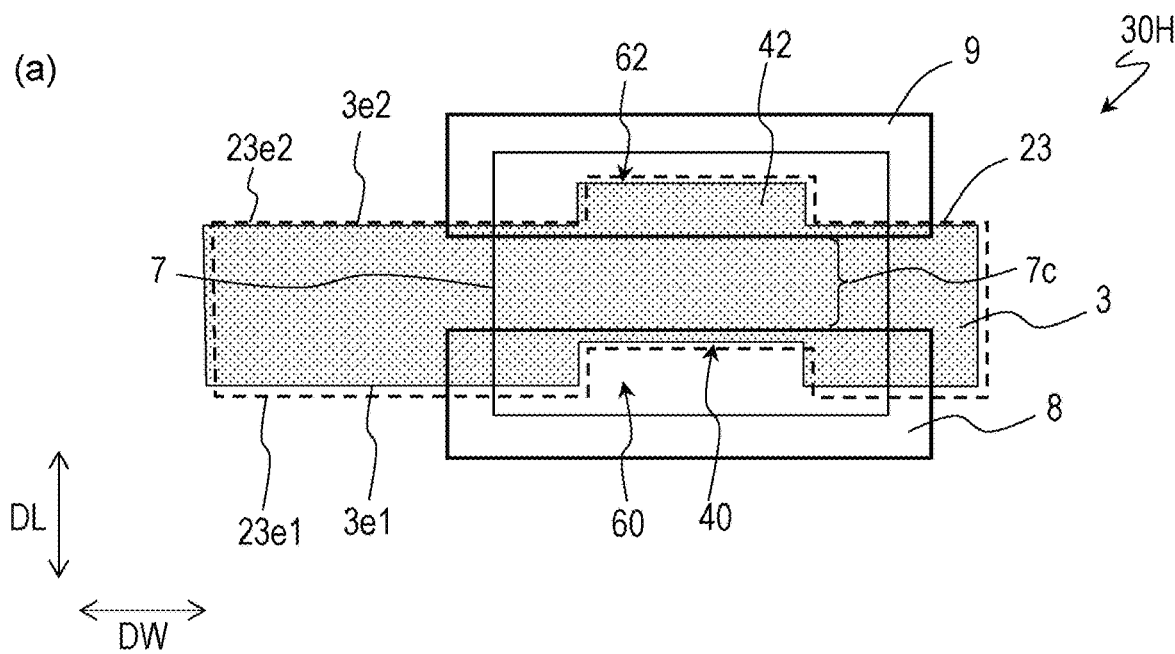
FIGS. 11(*a*) and 11(*b*) are plan views that illustrate still another circuit TFTs (thin-film transistors 30H, 30I) of the third embodiment, respectively.
Figure 11:
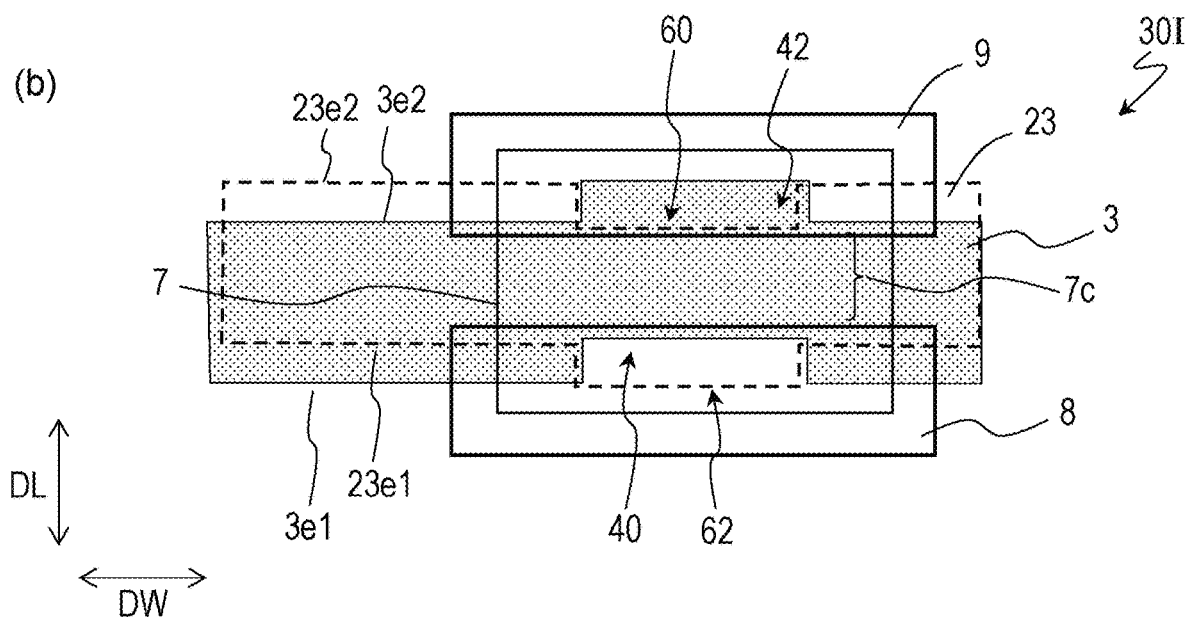

FIGS. 11(a) and 11(b) are plan views that illustrate still another circuit TFTs (thin-film transistors 30H, 30I) of the present embodiment, respectively.

In the thin-film transistor 30H illustrated in FIG. 11(a), when viewed in the direction normal to the substrate 1, it may be that one edge portion of the gate electrode 3 has the protruding portion 42, and the other edge portion has the recess portion 40, and that one edge portion of the upper gate electrode 23 has the protruding portion 62, and the other edge portion has the recess portion 60. The upper gate electrode 23 has the same planar shape as the gate electrode 3. That is, the protruding portion 62 of the upper gate electrode 23 is disposed corresponding to the protruding portion 42 of the gate electrode 3 and at least partially overlaps with the protruding portion 42. The recess portion 60 of the upper gate electrode 23 is disposed corresponding to the recess portion 40 of the gate electrode 3 and at least partially overlaps with the recess portion 40.

The thin-film transistor 30I illustrated in FIG. 11(b) is different from the thin-film transistor 30H in that the upper gate electrode 23 has a planar shape different from that of the gate electrode 3. In the thin-film transistor 30I, when viewed in the direction normal to the substrate 1, the protruding portion 62 of the upper gate electrode 23 is disposed corresponding to the recess portion 40 of the gate electrode 3 and at least partially overlaps with the recess portion 40. The recess portion 60 of the upper gate electrode 23 is disposed corresponding to the protruding portion 42 of the gate electrode 3 and at least partially overlaps with the protruding portion 42. In the thin-film transistor 30I, it is difficult to form an offset region in oxide semiconductor layer 7 as in the thin film transistor 30G. Therefore, it is advantageous because a predetermined on current can be secured more reliably.

(Configuration and Operation of SDD Circuit)

The thin-film transistors 30A to 30I described in the first to third embodiments can be applied to, for example, switching elements ("SSD circuit TFTs") of an SSD circuit provided in a peripheral region of a display device.

Figure 12:
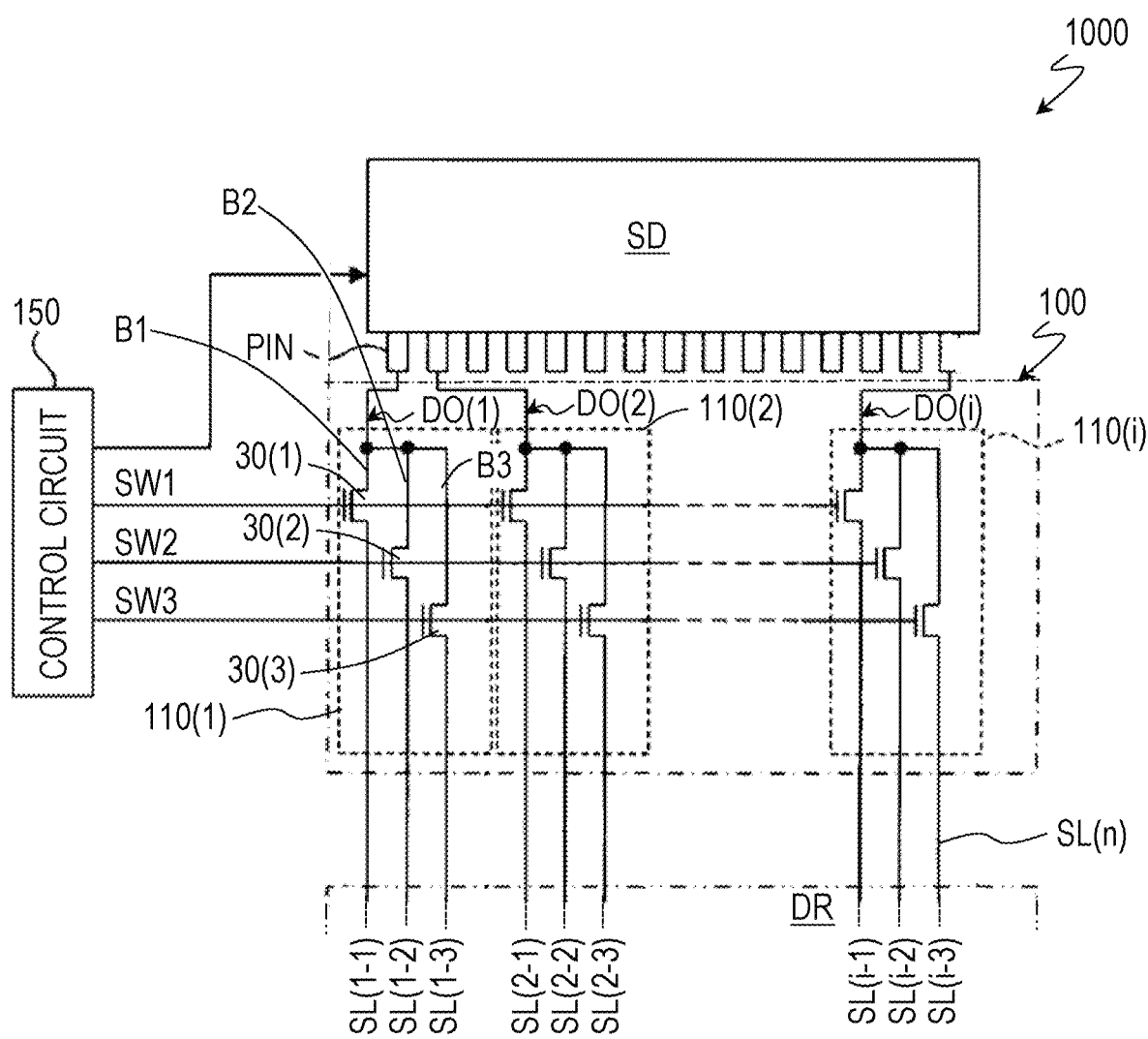
FIG. 12 is a diagram for describing a configuration and an operation of an SSD circuit 100 in an active matrix substrate 1000.

FIG. 12 is a diagram for describing a configuration and an operation of the SSD circuit 100 in the active matrix substrate 1000 according to the embodiments described above.

The SSD circuit 100 is disposed between a source driver SD and the display area DR. The SSD circuit 100 includes multiple SSD unit circuits (110(1) to 110(i) (i is an integer of two or more)(hereinafter, in some cases, collectively referred to as "SSD unit circuit 110"). The SSD circuit 100 and the source driver SD are controlled by a control circuit 150 provided in the non-display area FR.

Each of the output pins PIN of the source driver SD is connected to a corresponding one of multiple video signal lines DO(1) to DO (i) (collectively referred to as "video signal line DO" in some cases). One video signal line DO is associated with n (here, 3) (n is an integer that is equal to or greater than 2) source bus lines SL in a group. The SSD unit circuit 110 is provided on a per-video signal line basis between the video signal line DO and the source bus lines SL in a group. The SSD unit circuit 110 distributes video data from one video signal line DO to n source bus lines SL.

In the present specification, an N-th video signal line of the multiple video signal lines DO(1) to DO(i), and the SSD unit circuit 110 and the source bus line SL is defined as DO(N) (N is an integer from 1 to i), and the SSD unit circuit 110 and the source bus line SL that are associated with the video signal line DO(N) are defined as 110(N) and SL(N−1) to SL(N−n), respectively. The source bus lines SL(N−1) to SL(N−n), for example, may be associated with R, G, and B pixels, respectively (that is, n=3).

Each of the SSD unit circuit 110(N) includes n branch wiring lines B1 to Bn, that are connected to the video signal line DO(N), n control signal lines SW1 to SWn, and n SSD circuit TFTs 30(1) to 30(*n*) (hereinafter, in some cases, collectively referred to as "SSD circuit TFT 30"). The control signal lines SW1 to SWn are connected to the control circuit 150.

The SSD circuit TFT 30 functions as a selection switch. A gate electrode of the SSD circuit TFT 30 is electrically connected to the corresponding one of the control signal lines SW1 to Swn. A source electrode of the SSD circuit TFT 30 is electrically connected to the corresponding one of branch wiring lines B1 to Bn. A drain electrode of the SSD TFT 30 is connected to the source bus line corresponding to one of the source bus lines SL(N−1) to SL(N−3).

A selection signal is supplied from control signal lines SW1 to SW3 to the gate electrode of the SSD circuit TFT 30. The selection signal defines an ON duration of the selection switch within the same group and is synchronized with a time-series signal output from the source driver SD. The SSD unit circuit 110(N) writes (performs time-driving of) data electric potential that is obtained by time-dividing an output of the video signal line DO(N), to multiple source bus lines, the source bus line SL(N−1) to the source bus line SL(N−n) in a time-series manner. Accordingly, because the number of output pins PIN of the source driver SD can be reduced, an area of non-display area FR can be further reduced (frame-narrowing).

It is noted that operation of a display device that uses an SSD circuit 100, a timing chart of time division driving, and the like, for example, are disclosed in Japanese Unexamined Patent Application Publication Nos. 2008-225036 and 2006-119404, International Publication No. 2011/118079 (PTL 1) and other publications. For reference, the entire contents of Japanese Unexamined Patent Application Publication Nos. 2008-225036 and 2006-119404, and International Publication No. 2011/118079 are incorporated in the present specification by reference.

Figure 13:
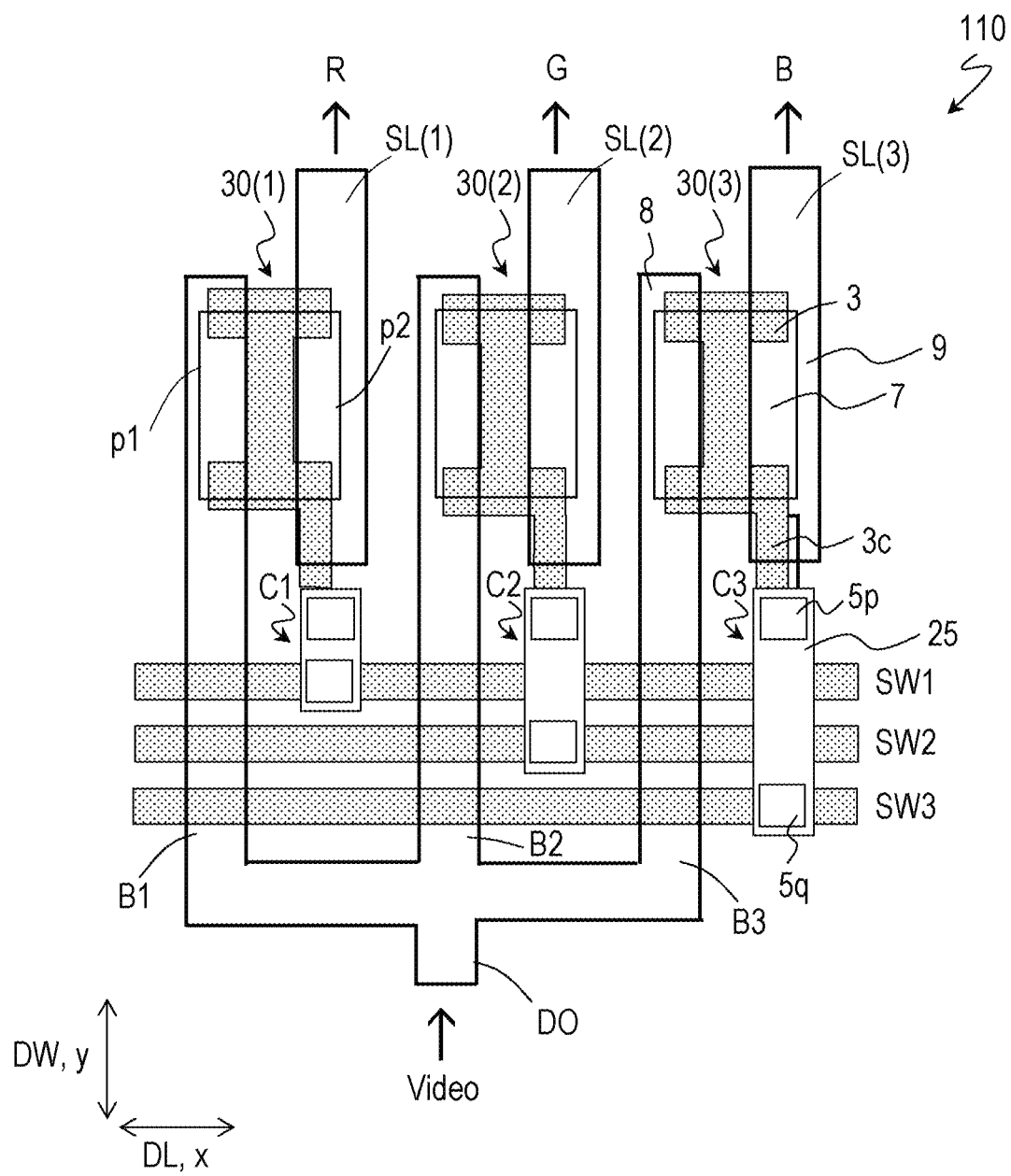
FIG. 13 is a plan view illustrating an SSD unit circuit 110.

FIG. 13 is a plan view illustrating an SSD unit circuit 110 according to the present embodiment. Here, in the SSD unit circuit 110, source bus lines SL(1) to SL(3) associated with R, G, and B pixels are disposed (that is, n=3).

The SSD unit circuit 110 includes three SSD circuit TFTs 30(1) to 30(3) (hereinafter, in some cases, collectively referred to as "SSD circuit TFT 30") that are supported on the substrate 1, source bus lines SL(1) to SL(3) (hereinafter, in some cases, collectively referred to as "source bus line SL") that extend from the display area DR, one video signal line DO, branch wiring lines B1 to B3 (hereinafter, in some cases, collectively referred to as "branch wiring line B"), and control signal lines SW1 to SW3 (hereinafter, in some case, collectively referred to as "control signal line SW"). The video signal line DO is electrically connected to the branch wiring lines B1 to B3. In the example, the source bus line SL extends in the y direction, and the control signal line SW extends in the x direction intersecting the y direction. The branch wiring line B and the video signal line DO are formed in the source metal layer. The gate electrode 3 and the control signal line SW are formed in the gate metal layer.

Each of the SSD circuit TFTs 30 has the same structure as the thin-film transistor 30B described above with reference to FIG. 3. It is noted that it may have the same structure as the other thin-film transistors 30A, 30C to 30I.

In the present embodiment, each of the SSD circuit TFTs 30 may is positioned between two adjacent source bus lines SL. In the example, the SSD circuit TFT 30 is positioned in such a manner that the channel length direction DL is approximately parallel to the x direction and that the channel width direction DW is approximately parallel to the y direction.

The source bus lines SL extend in the y direction from the display area to the source driver SD and is in contact with the upper surface of one end p2 of the corresponding oxide semiconductor layer 7 extending in the channel width direction DW. The portion of the source bus line SL that is in contact with the oxide semiconductor layer 7 functions as the drain electrode 9 of the SSD circuit TFT 30.

Each branch wiring line B extends in the y direction from the video signal line DO to the display area, and is in contact with the upper surface of the other end p1 of the corresponding oxide semiconductor layer 7 extending in the channel width direction DW. The portion of the branch wiring line B in contact with the oxide semiconductor layer 7 functions as the source electrode 8 of the SSD circuit TFT 30.

The gate electrode 3 of the SSD circuit TFT 30 is electrically connected to the corresponding control signal line SW. In the example, the gate electrode 3 extends toward the control signal line SW in the y direction. The extending portion 3c is referred to as "gate extension portion". The gate extension portion 3c is electrically connected to the corresponding control signal line SW via connection wiring line 25 that is formed within the source metal layer, at contact portions C1 to C3. The connection wiring lines 25 may be, for example, in contact with the gate extension portion 3c in a first opening 5p provided in the gate insulation layer 5 and may be in contact with the control signal line SW in a second opening 5q provided in the gate insulation layer 5.

The TFT 30 for the SSD circuit and the SSD circuit 100 may be covered with the inorganic insulation layer (passivation film) 11 (see FIG. 2A(b)). A planarization film such as an organic insulation film may or may not be provided on the inorganic insulation layer 11. For example, the display area DR of the active matrix substrate 1000 may be covered with the organic insulation film, and the non-display area FR may not be covered with the organic insulation film.

(Configuration of Pixel Area P)

Next, a configuration of each pixel area P in the active matrix substrate 1000 will be described. Here, the active matrix substrate applied to an LCD panel in an FFS mode will be described as an example.

Figure 14:
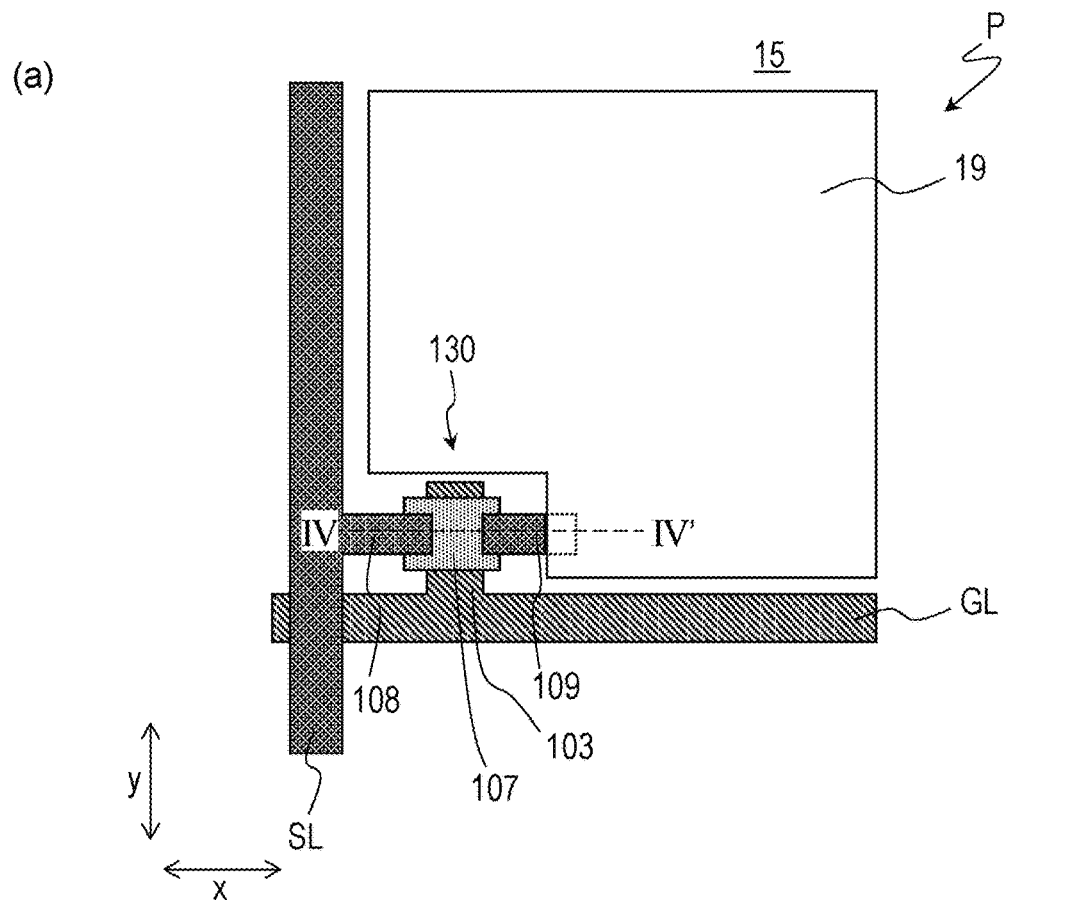
FIGS. 14(*a*) and 14(*b*) are a plan view of a pixel area P in the active matrix substrate 1000, and a cross-sectional view taken along line IV-IV, respectively.
Figure 14:
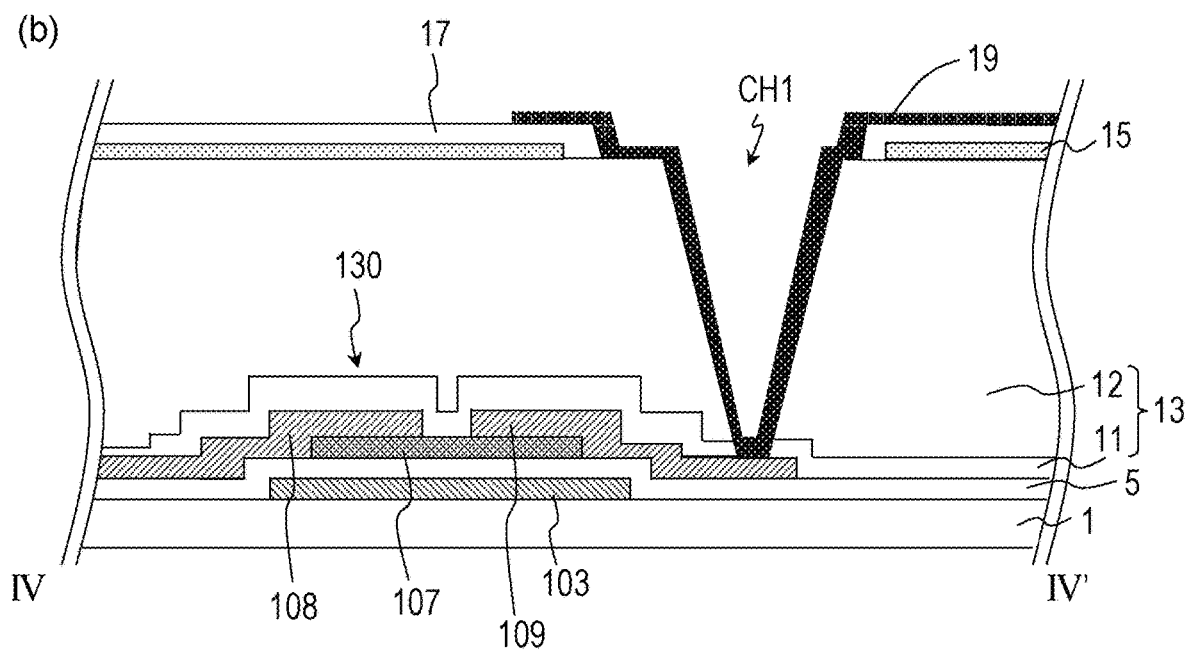

FIGS. 14(*a*) and 14(*b*) are a plan view of a pixel area P in the active matrix substrate 1000, and a cross-sectional view taken along line IV-IV, respectively.

The pixel area P is an area that is surrounded with the source bus line SL that extends in the y direction, and the gate bus line GL that extends in the x direction that intersects the source bus line SL. The pixel area P has the substrate 1, a TFT (hereinafter, referred to as "pixel TFT") 130 that is supported on the substrate 1, a lower transparent electrode 15 and an upper transparent electrode 19. Although not illustrated, the upper transparent electrode 19 has a slit or notch portion for each pixel. In the example, the lower transparent electrode 15 is a common electrode CE, and the upper transparent electrode 19 is a pixel electrode PE. The pixel TFT 10, for example, is an oxide semiconductor TFT that has the bottom gate structure.

In the embodiments described above, the upper gate electrodes 23 of the thin-film transistors 30B to 30I may be formed using the same transparent conductive film as the lower transparent electrode 15, or may be formed using the same transparent conductive film as the upper transparent electrode 19.

Next, a structure of the pixel TFT 130 is in more detail described.

The pixel TFT 130 is a TFT of a configuration of having a gate electrode 103 that is supported in the substrate 1, the gate insulation layer 5 that covers the gate electrode 103, the oxide semiconductor layer 107 that is formed on the gate insulation layer 5, and the source electrode 108 and the drain electrode 109 that are arranged in such a manner as to be brought into contact with the oxide semiconductor layer 107 are included. Each of the source electrode 108 and the drain electrode 109 is brought into contact with an upper surface of the oxide semiconductor layer 107.

The gate electrode 103 is connected to the corresponding gate bus line GL, and the source electrode 108 is connected to the corresponding source bus line SL. The drain electrode 109 is electrically connected to the pixel electrode PE. The gate electrode 103 and the gate bus line GL may be integrally formed within the gate metal layer. The source electrode 108 and the source bus line SL may be integrally formed within the source metal layer.

An interlayer insulation layer 13 is not specifically limited. Examples of the interlayer insulation layer 13 may include the inorganic insulation layer (passivation film) 11 and the organic insulation layer 12 disposed on the inorganic insulation layer 11. The interlayer insulation layer 13 may not the organic insulation layer 12.

The pixel electrode PE and the common electrode CE are disposed to partially overlap with each other via the dielectric layer 17. The pixel electrode PE is separated for each pixel. The common electrode CE may not be separated for each pixel. In the example, the common electrode CE may be formed on the interlayer insulation layer 13. The common electrode CE have an opening in the area where the pixel TFT 10 is formed, and may be formed over the entire pixel area P except for the area. The pixel electrode PE is formed on the dielectric layer 17 and is electrically connected to the drain electrode 109 in the opening CH1 provided in the interlayer insulation layer 13 and the dielectric layer 17.

This active matrix substrate 1000 can be applied to, for example, a display device in the FFS mode. The FFS mode is a lateral electric field mode in which a pair of electrodes are provided on one side of the substrate and an electric field is applied to liquid crystal molecules in a direction (lateral direction) parallel to the substrate surface. In the example, an electric field is generated, which is represented by lines of electric lines emitted from the pixel electrode PE, through a liquid crystal layer (not illustrated) and further through the slit-shaped opening of the pixel electrode PE, to the common electrode CE. The electric field has a component in the lateral direction with respect to the liquid crystal layer. As a result, it is possible to apply an electric field in the lateral direction to the liquid crystal layer. The lateral electric field method has an advantage that a wide viewing angle can be implemented as compared with the vertical electric field method because liquid crystal molecules do not rise from the substrate.

The electrode structure in which the pixel electrode PE is disposed on the common electrode CE via the dielectric layer 17 is described, for example, International Publication No. 2012/086513. The common electrode CE may be disposed on the pixel electrode PE via the dielectric layer 17. That is, the lower transparent electrode 15 may be pixel electrode PE, and the upper transparent electrode 19 may be the common electrode CE. This electrode structure is described, for example, in Japanese Unexamined Patent Application Publication Nos. 2008-032899 and 2010-008758. For reference, the entire contents of International Publication No. 2012/086513, Japanese Unexamined Patent Application Publication No. 2008-032899, and Japanese Unexamined Patent Application Publication No. 2010-008758 are incorporated herein by reference.

(Material and Thickness of Each Layer in Active Matrix Substrate 1000)

The substrate 1 may be, for example, a glass substrate, a silicon substrate, a plastic substrate (resin substrate) having heat resistance, or the like.

The gate metal layer (thickness: for example, 50 nm or more and 500 nm or less) including the gate electrode 3 and the gate bus line GL is formed of, for example, a metal such as aluminum (Al), tungsten (W), molybdenum (Mo), tantalum (Ta), chromium (Cr), titanium (Ti), copper (Cu) or an alloy thereof, or a metal nitride thereof. Moreover, the gate metal layer may be formed of a stacked film in which multiple films of the elements are stacked. The gate metal layer can be formed by forming a metal film on the substrate 1 by sputtering or the like and patterning the metal film by a known photolithography process (photoresist application, exposure, development, etching, resist peeling). The etching is performed by, for example, wet etching.

The gate insulation layer 5 (thickness: for example, 200 nm or more and 500 nm or less) is for example, a silicon oxide (SiOx) layer, a silicon nitride (SiNx) layer, a silicon oxynitride (SiOxNy; x>y) layer, silicon nitride oxide (SiNxOy; x>y), and the like. The gate insulation layer 5 may have a stacked structure. In this case, when the $SiO_2$ film is disposed on the side of the gate insulation layer 5 in contact with the oxide semiconductor layer 7, it is possible to effectively reduce oxygen deficiencies in the oxide semiconductor layer 7.

The oxide semiconductor layer 7 is formed of, for example, an oxide semiconductor film (thickness: for example, 15 nm or more and 200 nm or less) such as In—Ga—Zn—O-based semiconductor.

The source metal layer (thickness: for example, 50 nm or more and 500 nm or less) including the source electrode 8, the drain electrode 9 and the source bus line SL is formed using a metal such as aluminum (Al), tungsten (W), molybdenum (Mo), tantalum (Ta), chromium (Cr), titanium (Ti), copper (Cu) or an alloy thereof, or a metal nitride thereof. Moreover, the source metal layer may be formed of a stacked film in which multiple films of the elements are stacked. The source metal layer may have a stacked structure in which a Ti film (thickness: 30 nm), an Al or Cu film (thickness: 300 nm), and a Ti film (thickness: 50 nm) are stacked in this order from the oxide semiconductor layer side.

The inorganic insulation layer 11 (thickness: for example, 100 to 500 nm, preferably 200 to 500 nm), is formed of, for example, an inorganic insulation film (passivation film) such as a silicon oxide (SiOx) film, a silicon nitride (SiNx) film, a silicon oxynitride (SiOxNy; x>y) film, a silicon nitride oxide (SiNxOy; x>y) film, and the like. The inorganic insulation layer 11 may have a stacked structure. When the SiO2 film disposed on the side of the inorganic insulation layer 11 in contact with the oxide semiconductor layer 7, it is possible to effectively reduce oxygen deficiencies in the oxide semiconductor layer 7.

The organic insulation layer 12 (thickness: for example, 1 to 3 μm, preferably 2 to 3 μm) is formed of, for example, an organic insulation film containing a photosensitive resin material.

Each of the lower transparent electrode 15 and the upper transparent electrode 19 (thickness: for example, 50 nm or more and 200 nm or less) may be formed of, for example, an ITO (indium tin oxide) film, an In—Zn—O based oxide (indium zinc oxide) film, ZnO film (zinc oxide film), or the like. The second inorganic insulation layer 17 (thickness: for example, 70 nm or more and 300 nm or less) may be formed of a silicon nitride (SiNx) film, a silicon oxide (SiOx) film, a silicon oxynitride (SiOxNy; x>y) film, a silicon nitride oxide (SiNxOy; x>y) film, or the like.

<TFT Structure>

The circuit TFTs 30A to 30I and the pixel TFT 130 according to the first and third embodiments described above are channel etch type TFTs. In the channel etch type TFT, an etch stop layer is not formed on the channel region, and the lower surface of the end on the channel side of the source and drain electrodes is disposed to be in contact with the upper surface of the oxide semiconductor layer. The channel etch type TFT is formed, for example, by forming a conductive film for source/drain electrodes on the oxide semiconductor layer and performing source/drain separation. In the source/drain separation, the surface portion of the channel region may be etched.

<Oxide Semiconductor>

The oxide semiconductor that is included in the oxide semiconductor layers may be an amorphous oxide semiconductor and may be a crystalline oxide semiconductor that has a crystalline portion. As the crystalline oxide semiconductor, a polycrystalline oxide semiconductor, a microcrystalline oxide semiconductor, a crystalline oxide semiconductor in which a c-axis aligns roughly vertically with a layer surface, or the like is given.

The oxide semiconductor layer may have a two- or greater-layered structure. In a case where the oxide semiconductor layer has a multi-layered structure, the oxide semiconductor layer may include a non-crystalline oxide semiconductor layer and a crystalline oxide semiconductor layer. Alternatively, the oxide semiconductor layer may include multiple crystalline oxide semiconductor layers that have different crystal structures. Furthermore, the oxide semiconductor layer may include multiple non-crystalline oxide semiconductor layers. In a case where the oxide semiconductor layer has a two-layered structure in which an upper layer and a lower layer are included, it is preferable that an energy gap of an oxide semiconductor that is contained in the upper layer is set to be greater than an energy gap of an oxide semiconductor that is contained in the lower layer. However, in a case where a difference in the energy gap between the upper and lower layers is comparatively small, the energy gap of the oxide semiconductor in the lower layer may be set to be greater than the energy gap of the oxide semiconductor in the upper layer.

Materials and structures of the non-crystalline oxide semiconductor and each of the crystalline oxide semiconductors described above, a film formation method, a structure of the oxide semiconductor layer that has a multi-layered structure, and the like, for example, are described in Japanese Unexamined Patent Application Publication No. 2014-007399. For reference, the entire contents of Japanese Unexamined Patent Application Publication No. 2014-007399 are incorporated in the present specification by reference.

The oxide semiconductor layer, for example, may include at least one type of metal element among In, Ga, and Zn. In the present embodiment, the oxide semiconductor layer, for example, contains an In—Ga—Zn—O-based semiconductor (for example, oxide indium gallium zinc). The In—Ga—Zn—O-based semiconductor here is a ternary oxide material that consists of Indium (In), Gallium (Ga), and Zinc (Zn). A ratio (a composition ratio) among In, Ga, and Zn is not particularly limited. Examples of the ratio include In:Ga:Zn=2:2:1, In:Ga:Zn=1:1:1, In:Ga:Zn=1:1:2, and the like. This oxide semiconductor layer can be formed from an oxide semiconductor layer that contains an In—Ga—Zn—O-based semiconductor.

The In—Ga—Zn—O-based semiconductor may be amorphous and may be crystalline. A crystalline in-Ga—Zn—O-based semiconductor in which a c-axis aligns roughly vertically with a layer surface is preferable as a crystalline In—Ga—Zn—O-based semiconductor.

It is noted that a crystal structure of the crystalline In—Ga—Zn—O-based semiconductor, for example, is disclosed in Japanese Unexamined Patent Application Publication Nos. 2014-007399, 2012-134475, and 2014-209727, which are described above, and other publications. For reference, the entire contents of Japanese Unexamined Patent Application Publication Nos. 2012-134475 and 2014-209727 are incorporated in the present specification by reference. A TFT that has an In—GA-Zn—O-based semiconductor layer has high mobility (which is more than 20 times higher than that of an a-Si TFT) and a small amount of leak current (which is less than one-hundredth of that of the a-Si TFT). Because of this, the TFT is suitably used as a drive TFT (for example, a TFT that is included in a drive circuit which is provided on the same substrate as a display area, in the vicinity of the display area that includes multiple pixels) and a pixel TFT (a TFT that is provided in a pixel).

The oxide semiconductor layer may contain any other oxide semiconductor instead of the In—Ga—Zn—O-based semiconductor. For example, an In—Sn—Zn—O-based semiconductor (for example, $In_2O_3$—$SnO_2$—ZnO; InSnZnO) may be contained. The In—Sn—Zn—O-based semiconductor is a ternary oxide material that consists of Indium (In), Tin (Sn), and Zinc (Zn). Alternatively, the oxide semiconductor layer may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, Cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, or the like.

INDUSTRIAL APPLICABILITY

According to the present invention, the embodiments can suitably find application in an active matrix substrate that has a peripheral circuit which is monolithically formed. This active matrix substrate finds application in display devices, such as liquid crystal display devices, organic electroluminescence (EL) display devices, and inorganic electroluminescence display devices, imaging devices such as image sensor devices, and various electronic devices, such as image input devices, fingerprint reading devices, and semiconductor memories.

REFERENCE SIGNS LIST 1 substrate
3 gate electrode
3e1, 3e2 edge portion of the gate electrode
5 gate insulation layer 7 oxide semiconductor layer
7c channel region
7d drain contact area
7s source contact area
7off offset region
8 source electrode
8e source edge portion
9 drain electrode
9e drain edge portion
11 inorganic insulation layer
23 upper gate electrode
23e1, 23e2 edge portion of upper gate electrode
30A to 30I thin-film transistor (circuit TFT)
40, 40d, 40s recess portion of gate electrode
41 first part of gate electrode
42 protruding portion of gate electrode
43 notch portion of gate electrode
50, 50d, 50s recess portion of source or drain electrode
52 protruding portion of source or drain electrode
53 notch portion of source or drain electrode
60, 60d, 60s recess portion of upper gate electrode
62, 62d, 62s protruding portion of upper gate electrode
63 notch portion of upper gate electrode
1000 active matrix substrate
DL channel length direction
DW channel width direction
Loff offset width
DR display area
FR non-display area
GD gate driver
SD source driver
P pixel area
PE pixel electrode
GL gate bus line
SL source bus line
B, B1 TO B3 branch wiring line
C1 TO C3 contact portion
DO video signal line
SW, SW1 TO SW3 control signal line

The invention claimed is:

1. An active matrix substrate that has a display area including multiple pixels and that has a non-display area provided in a vicinity of the display area, the active matrix substrate comprising:
   a substrate;
   at least one thin-film transistor (TFT) that is supported on the substrate and disposed in the non-display area; and
   a peripheral circuit including the at least one TFT,
   wherein the at least one TFT includes
      a first gate electrode,
      a gate insulation layer that covers the first gate electrode,
      an oxide semiconductor layer disposed on the gate insulation layer so as to at least partially overlap with the first gate electrode via the gate insulation layer,
      a source electrode disposed on the oxide semiconductor layer so as to be in contact with one end of the oxide semiconductor layer, and
      a drain electrode disposed on the oxide semiconductor layer so as to be in contact with another end of the oxide semiconductor layer,
   wherein, when viewed in a direction normal to the substrate, the first gate electrode has a first edge portion and a second edge portion opposing each other, the first edge portion and the second edge portion extend across the oxide semiconductor layer in a channel width direction of the at least one TFT, and at least one of the first edge portion and the second edge portion has, in a region overlapping with the oxide semiconductor layer, a first recess portion recessed in a channel length direction of the at least one TFT and a first part adjacent to the first recess portion in the channel width direction, and
   wherein, when viewed in the direction normal to the substrate, the source electrode or the drain electrode overlaps with at least a part of the first recess portion and at least a part of the first part.

2. The active matrix substrate according to claim 1, wherein, when viewed in the direction normal to the substrate, both of the first edge portion and the second edge portion have the first recess portion in the region overlapping with the oxide semiconductor layer.

3. The active matrix substrate according to claim 1, wherein, when viewed in the direction normal to the substrate, one of the first edge portion and the second edge portion has the first recess portion in the region overlapping with the oxide semiconductor layer, and another of the first edge portion and the second edge portion has a first protruding portion protruding in the channel length direction and has two notch portions each positioned on a corresponding one of both sides of the first protruding portion in the region overlapping with the oxide semiconductor layer, and
   wherein, when viewed in the direction normal to the substrate, the source electrode or the drain electrode overlaps with at least a part of the first protruding portion and at least a part of the two notch portions.

4. The active matrix substrate according to claim 3, wherein, when viewed in the direction normal to the substrate, one of a source edge portion of the source electrode which opposes the drain electrode and a drain edge portion of the drain electrode which opposes the source electrode has a second protruding portion protruding in the channel length direction and another of the source edge portion of the source electrode which opposes the drain electrode and the drain edge portion of the drain electrode which opposes the source electrode has a second recess portion recessed in the channel length direction, and
   wherein the second protruding portion overlaps with at least a part of the first protruding portion, and the second recess portion overlaps with at least a part of the first recess portion.

5. The active matrix substrate according to claim 1, wherein a width of the first recess portion in the channel width direction is 20% or more and 80% or less of a channel width W of the at least one TFT, and a depth of the first recess portion is 20% or more and 80% or less of a channel length L of the at least one TFT.

6. The active matrix substrate according to claim 1, wherein the oxide semiconductor layer has an offset region between the source electrode and the drain electrode when viewed in the direction normal to the substrate, the offset region not overlapping with any of the source electrode, the drain electrode, and the first gate electrode, and
   wherein, when viewed in the direction normal to the substrate, the offset region overlaps with a part of the first recess portion.

7. The active matrix substrate according to claim 1, wherein, when viewed in the direction normal to the substrate, a source edge portion of the source electrode which opposes the drain electrode and/or a drain edge portion of the drain electrode which opposes the source electrode has a second recess portion recessed in the channel length direction, and the second recess portion overlaps with at least a part of the first recess portion.

8. The active matrix substrate according to claim 1, further comprising:
a transparent electrode disposed in the display area,
wherein the at least one TFT further includes a second gate electrode disposed on the oxide semiconductor layer via an insulation film, and
wherein the second gate electrode is formed using the same transparent conductive film as the transparent electrode.

9. The active matrix substrate according to claim 8,
wherein, when viewed in the direction normal to the substrate, the second gate electrode has a third edge portion and a fourth edge portion opposing each other, the third edge portion and the fourth edge portion extend across the oxide semiconductor layer in the channel width direction, and at least one of the third edge portion and the fourth edge portion has a third recess portion recessed in the channel length direction in the region overlapping with the oxide semiconductor layer, and
wherein, when viewed in the direction normal to the substrate, the third recess portion at least partially overlaps with the first recess portion, and the source electrode or the drain electrode at least partially overlaps with both of the third recess portion and the first recess portion.

10. The active matrix substrate according to claim 8,
wherein, when viewed in the direction normal to the substrate, the second gate electrode has a third edge portion and a fourth edge portion opposing each other, the third edge portion and the fourth edge portion extend across the oxide semiconductor layer in the channel width direction, and at least one of the third edge portion and the fourth edge portion has a third protruding portion protruding in the channel length direction in the region overlapping with the oxide semiconductor layer, and
wherein, when viewed in the direction normal to the substrate, the third protruding portion at least partially overlaps with the first recess portion, and the source electrode or the drain electrode at least partially overlaps with both of the third protruding portion and the first recess portion.

11. The active matrix substrate according to claim 1, further comprising:
multiple source bus lines extending in the channel width direction and multiple gate bus lines extending in the channel length direction, in the display area,
wherein the peripheral circuit includes a source switching circuit that distributes video data from one video signal line to n source bus lines (n is an integer of two or more) among the multiple source bus lines.

12. The active matrix substrate according to claim 1,
wherein, when viewed in the direction normal to the substrate, an overlap area of the drain electrode and the first gate electrode is smaller than an overlap area of the source electrode and the first gate electrode.

13. The active matrix substrate according to claim 1,
wherein the oxide semiconductor layer includes an In—Ga—Zn—O-based semiconductor.

14. The active matrix substrate according to claim 13,
wherein the In—Ga—Zn—O-based semiconductor includes a crystalline portion.

* * * * *